US006704371B1

(12) United States Patent
Hishiki et al.

(10) Patent No.: US 6,704,371 B1
(45) Date of Patent: *Mar. 9, 2004

(54) RECEIVER FOR COMMUNICATION

(75) Inventors: Yuji Hishiki, Chiba (JP); Isamu Fujii, Chiba (JP); Yoshiaki Saka, Chiba (JP); Shinichi Idomukai, Chiba (JP)

(73) Assignee: Seiko Instruments Inc., Chiba (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/646,304

(22) PCT Filed: Aug. 24, 1995

(86) PCT No.: PCT/JP95/01677
§ 371 (c)(1),
(2), (4) Date: Jul. 11, 1996

(87) PCT Pub. No.: WO96/07254
PCT Pub. Date: Mar. 7, 1996

(30) Foreign Application Priority Data

Aug. 30, 1994 (JP) .............................................. 6-205712
Oct. 27, 1994 (JP) .............................................. 6-264209
Nov. 7, 1994 (JP) .............................................. 6-272589
Nov. 30, 1994 (JP) .............................................. 6-297549
Dec. 16, 1994 (JP) .............................................. 6-313648

(51) Int. Cl.[7] .............................................. H04L 27/06
(52) U.S. Cl. ........................ 375/316; 375/346; 714/715; 714/758; 714/765

(58) Field of Search ........................ 371/41, 37.8, 37.1; 375/224, 316, 346; 714/715, 765, 793, 775, 758

(56) References Cited

U.S. PATENT DOCUMENTS

| 4,193,062 | A | * | 3/1980 | En .............................. 714/793 |
| 4,236,247 | A | * | 11/1980 | Sundberg .................... 714/765 |
| 4,298,981 | A | * | 11/1981 | Byford ....................... 714/715 |
| 4,355,391 | A | * | 10/1982 | Alsop, IV ................... 371/37.8 |
| 4,360,916 | A | * | 11/1982 | Kustedjo et al. ........... 371/37.8 |
| 5,051,999 | A | * | 9/1991 | Erhart et al. .................. 371/41 |
| 5,408,476 | A | * | 4/1995 | Kawai et al. ............... 371/37.1 |

* cited by examiner

Primary Examiner—Shuwang Liu
(74) Attorney, Agent, or Firm—Adams & Wilks

(57) ABSTRACT

A low noise and lower power consumption receiver including a CRC error correction circuit which is constructed at low cost, prolongs a life of a battery and enhances a receiving sensitivity. The receiver comprises a data processing unit which continuously determines errors in received data encoded by a CRC code and corrects them by comparing with reference syndrome patterns, a microprocessor circuit including a data RAM connected with local data buses and local address buses and a serial data receiving apparatus including state control means, a synchronizing circuit, an ID comparing circuit and a circuit for gating system clock. The high performance and low power consumption receiver may be realized with less additional circuits, having more flexibility to the increase of services.

16 Claims, 37 Drawing Sheets

FIG. 11

| ERROR BIT | SYNDROME VECTOR PATTERN | ERROR BIT | SYNDROME VECTOR PATTERN |
|---|---|---|---|
| 0 | 0000000000 | 16 | 0101111101 |
| 1 | 0000000001 | 17 | 1011111010 |
| 2 | 0000000010 | 18 | 1010011101 |
| 3 | 0000000100 | 19 | 1001010011 |
| 4 | 0000001000 | 20 | 1111001111 |
| 5 | 0000010000 | 21 | 0011110111 |
| 6 | 0000100000 | 22 | 0111101110 |
| 7 | 0001000000 | 23 | 1111011100 |
| 8 | 0010000000 | 24 | 0011010001 |
| 9 | 0100000000 | 25 | 0110100010 |
| 10 | 1000000000 | 26 | 1101000100 |
| 11 | 1101101001 | 27 | 0111100001 |
| 12 | 0110111011 | 28 | 1111000010 |
| 13 | 1101110110 | 29 | 0011101101 |
| 14 | 0110000101 | 30 | 0111011010 |
| 15 | 1100001010 | 31 | 1110110100 |

RECEIVER FOR COMMUNICATION

This application is a continuation of PCT/JP95/01677 filed on Aug. 24, 1995, disclosure of which is incorporated herein by reference.

BACKGROUND OF THE INVENTION

1. Field of the Invention

The present invention relates to a receiver including a data processing unit adapted so as to correct two-bit errors in received data by using a cyclic redundancy check (CRC) code.

The present invention relates to a receiver including a data processing unit for determining errors in data to be checked by using the cyclic redundancy check (CRC) code.

The present invention also relates to a receiver including an ID controlling portable synchronous serial data receiving apparatus having a timer function.

The present invention further relates to a receiver including an ID controlling portable serial data receiving apparatus used for a radio paging apparatus (hereinafter referred to as a pager) or the like.

2. Description of the Related Art

As a circuit for correcting errors within received data encoded by a CRC code, a circuit shown in FIG. 10 is known for example. An error correction circuit 100 shown in FIG. 10 comprises a shift register circuit 105 for holding data to be checked SIG having a certain number of bits in response to a clock signal CLK2, a syndrome generating circuit 103 for generating syndromes by implementing a modulo-two arithmetic on the data to be checked SIG in response to a clock signal CLK1 and a decoder ROM 300 for decoding syndrome data generated by the syndrome generating circuit 103.

The decoder ROM 300 is arranged so as to instruct to make a correction on an error bit indicated by the syndrome data. The error in the received data is corrected by turning a selection signal SELECT to a "H" level with a predetermined timing and supplying one pulse as the clock signal CLK2 to the shift register circuit 105. The resultant data is held within the shift register circuit 105 by being shifted by one bit.

A data processing circuit for detecting a boundary of words utilizing error detection by means of BCH code is known to be used in a paging decoder for example to synchronize bit serial input data transmitted per bit in a time-division manner with the internal operation. The prior art data processing circuit of this type is arranged so as to detect errors in input data having a predetermined number of bits N by means of the BCH code by N times, to acquire next one bit anew when it is determined that there exists an error and to repeat the same process for detecting errors again by N times until it is determined that there exists no more error.

FIGS. 19 through 24 show one example of the prior art data processing circuit of this type. The data processing circuit 101 shown in FIGS. 19 through 24 comprises a data register 102, a syndrome generating circuit 103 and a switching circuit 224 for selectively supplying either input data RD from an input terminal 223 or an output of the data register 102 to an input terminal 223 of the data register 102 in response to a selection control signal SL.

The data register 102 is a shift register circuit having a known structure for holding data supplied to its input terminal by acquiring it on a bit-by-bit basis in response to a clock pulse CL supplied from a clock input terminal 225 every time when the clock pulse CL is input. The held data may be taken out of its output terminal 246 in response to the clock pulse CL.

The syndrome generating circuit 103 is a circuit for generating a syndrome by acquiring the input data RD in response to a the clock pulse CL supplied via an AND gate 252 when the selection control signal turns to "H" level and by implementing modulo-two arithmetic. A logical circuit 106 determines whether a value of the generated syndrome is 0 or not.

The result determined by the logical circuit 106 is supplied as a set signal to a flip-flop 243 which has been put into a reset state by a first set signal RT1 from a terminal 250 when a check pulse CH is added from a terminal 251.

The data processing circuit 101 operates as follows. This will be explained with reference to FIG. 25. At first, when the first reset signal RT1 and a second reset signal RT2 supplied to a terminal 226 turn to "L" level for a short time at time T1, the data register 102, the syndrome generating circuit 103 and the flip-flop 243 are reset, respectively, thereby completing their initialization. After that, 31 clock pulses CL are output when the selection control signal SL is at the "L" level and thereby 31 bits of input data RD is taken into the data register 102.

Next, when the selection control signal SL is switched from a "L" level to "H" level at time T2, a loop structure in which an output of the data register 102 is returned to its input is formed and the 31 bits of data held in the data register 102 is cyclically shifted per bit by 31 clock pulses CL supplied after time T2.

At the same time, those 31 clock pulses CL are supplied also to the syndrome generating circuit 103 via an AND gate 252 opened by the selection control signal SL and thereby the syndrome for the 31 bits of data held in the data register 102 is calculated.

A value of the syndrome is stored in the flip-flop 243 by the check pulse CH output at time T3. If the value of the syndrome at this time is 0, a level of the detection terminal 245 turns to "H", meaning that the word boundary could have been detected. However, if the value of the syndrome is a number other than 0, data of the next bit is taken in to be checked.

That is, after turning the level of the selection control signal to "L" at time T4, only one clock pulse CL is given at time T5 to input one new bit data to the data register 102 and the syndrome generating circuit 103 is reset by the first reset signal RT1 at time T6.

Then, the level of the selection control signal SL is turned from "L" to "H" at time T7 to supply 31 clock pulses CL again to execute the calculation of a syndrome for the new set of input data held in the data register 102.

Thus, the acquisition of one bit of data and the calculation of a syndrome are repeatedly executed until the value of the syndrome becomes 0, i.e. until the word boundary is detected.

As a synchronous serial data receiving apparatus, one as shown in FIG. 27 in block diagram form has been used in the past. This receiving apparatus has bit synchronizing means and word synchronizing means and determines whether data should be received or not by determining whether it is in a state synchronous or asynchronous to a signal to be transmitted.

FIG. 29 shows a transition of receiving state of the prior art serial data receiving apparatus. This is considered to correspond only to RUN mode in FIG. 28 and only the receiving state shifts between an asynchronous state and a synchronous state in response to detection and non-detection of a synchronous code.

In FIG. 27, a timer counter 112 and a timing generating circuit 113 connected to an oscillation circuit 111 supply a timer function and operation timing clocks of each part, respectively. At first, the bit synchronizing means 118 establishes a bit synchronism with an input signal input from a data input terminal 117. Next, the word synchronizing means 119 establishes a word synchronism. When the word synchronism has been established, the word synchronizing means 119 outputs a control signal to the timing generating means 113 and starts to receive ID and data. The received ID is compared with a content in ID storage means 122 by ID collating means 121. When the ID is collated without any trouble, a control signal is output from the ID collating means 121 to the timing generating means 113 to continue to receive the data. When the ID cannot be collated, the receiving is terminated. The received data is once stored in data storage means 120 and is output from a data output terminal 124 via an output circuit 123.

The ID storage means 122 is normally composed of a register. The content therein is written generally from a control input terminal 116 during the initialization. There is a possibility that an erroneous operation is ensued during the collation of IDs if the ID is rewritten during receiving. Therefore, it is necessary to initialize to stop the receiving once in resetting the ID.

As an ID controlling portable serial data receiving apparatus used for a pager or the like, one as shown in FIG. 31 in block diagram form has been used in the past. In the figure, a line with a short slant line indicates that it comprises a plurality of lines. The receiving apparatus comprises a decoder circuit A having a synchronizing circuit 132, an error correction circuit 133, an ID collating or comparison circuit 134 and a control circuit 135, a microprocessor circuit B having a CPU core circuit 136, a data RAM 138 and a program ROM 137 and a register circuit 139 for bridging data from the decoder circuit A.

In FIG. 31, a serial data input 131 is input to the synchronizing circuit 132 within the decoder circuit A. When synchronism is established by the synchronizing circuit 132, the data is acquired in succession. The acquired data is corrected as necessary by the error correction circuit 133 and it is determined if the ID coincides or not by the ID collating circuit 134. When it is confirmed that the ID coincides, a message is received in succession. Errors in the received message are corrected similarly to the case of the ID. Then, information on the received ID, the message and accompanying error information are stored in the register circuit 139. When the ID is confirmed to coincide and the ID information and message are stored in the register circuit 139, the control circuit 135 in the decoder circuit A generates an interrupt request by way of an interrupt control signal 142 to the CPU core circuit 136 of the microprocessor circuit B. In response to the interrupt request, the microprocessor circuit B accesses the register circuit 139. Thus, the received address information and message information are taken into the microprocessor circuit B.

It is also possible to use another conventional method for the interface between the decoder circuit A and the microprocessor circuit B. A micro-controller carrying a DMAC is described in Japanese Patent Publication No. 59-42331. The use of DMA eliminates the necessity to operate the CPU core circuit 136 fully in writing the data received by the decoder circuit A to the data RAM 138. The operation in this case is carried out as follows.

Because the operation until the time the interrupt is generated after receiving the serial data input is the same with that described above, its explanation is omitted here. In response to the interrupt request, the microprocessor B executes a DMA instruction. When the DMA instruction is executed, the data received by the decoder circuit A is transferred to and stored in the data RAM 138 in synchronism with system clock timing of the CPU core circuit 136. When all the received data is written to the data RAM 138, the microprocessor circuit ends the DMA operation.

As another ID control portable serial data receiving apparatus used for a pager or the like, one as shown in FIG. 34 in block diagram form has been used in the past. The receiving apparatus comprises a decoder circuit A having a synchronizing circuit 132, an error correction circuit 133, an ID collating circuit 134 and a control circuit 135, a microprocessor circuit B having a CPU core circuit 136, a data RAM 138 and a program ROM 137 and a register circuit 139 for bridging data from the decoder circuit A.

In FIG. 34, a serial data input 131 is input to the synchronizing circuit 132 within the decoder circuit A. When a synchronism is established by the synchronizing circuit 132, the data is acquired in succession. The acquired data is corrected as necessary by the error correction circuit 133 and is determined if its ID coincides or not by the ID collating circuit 134. When it is confirmed that the ID coincides, a message is received in succession. Errors in the received message are corrected similarly to the case of the ID. Then, the information of received ID, message and accompanying error information are stored in the register circuit 139. When the ID is confirmed to coincide and the ID information and message are stored in the register circuit 139, the control circuit 135 in the decoder circuit A generates an interrupt request by way of an interrupt control signal 132 to the CPU core circuit 136 of the microprocessor circuit B. In response to the interrupt request, the microprocessor circuit B accesses the register circuit 139. Thus, the received address information and message information are taken into the microprocessor circuit B.

Several methods for collating the IDs described below are known. The simplest way is to include an ID code register in the ID collating circuit 134. Because this way allows the device to collate the ID code in real-time when it is received, no burden is placed on the microprocessor circuit B. FIG. 35 shows a circuit structure of a prior art serial data receiving apparatus for carrying out this method in the form of a block diagram.

In FIG. 35, a serial data input 131 is input to the synchronizing (or synchronization) circuit 132. When synchronism is established by the synchronizing circuit 132, the data is acquired in succession. The acquired data is corrected as necessary by the error correction circuit 133 and is sent to a buffer register 157 within the ID collating circuit 134. The content of the buffer register 157 is examined and it is determined if it coincides with an ID stored in the ID register circuit 156 or not by the comparison circuit 151. In determining this, the control circuit 154 operates a selector circuit 155 under the timing of the synchronization signal for the serial data input to compare the ID with all IDs within the ID register circuit 156. When the content of the buffer register 157 coincides with one ID among the IDs in the ID register circuit 156, a message is received in succession.

As another method, there is a method of transferring a plurality of ID codes stored in the data RAM in advance sequentially to the ID collating circuit 134 from the microprocessor circuit B when an ID code is received to collate them.

As a still other method, it is conceivable to perform all the collation of the ID codes through the operation of the microprocessor circuit B. In this case, the ID collating circuit 134 becomes unnecessary.

With the recent widespread dissemination of radio communication systems and the diversification of communication services, the number of IDs assigned to portable radio terminals is likely to increase year by year. Thus, terminals which can accommodate flexibly the diversification of the communication systems and communication services will be required along the liberalization of the communication systems and communication services for the future.

As a still other ID controlling portable serial data receiving apparatus used for a pager or the like, one as shown in FIG. 37 in block diagram form has been used in the past. The receiving apparatus comprises a reference clock generating circuit 113 for generating timing signals by receiving an output of an oscillator circuit 111, a synchronizing circuit 132 for synchronizing with data input from a serial data input terminal 131 by receiving the clock output 160, an error correction circuit 133 for detecting and correcting errors in the synchronized and acquired data and an ID collating circuit 134 connected with a bus line of a microprocessor circuit. The clock input to the microprocessor circuit B may be stopped by using a latch 162. The latch 162 is set by a latch data 166 and a latch clock 165 and the setting may be released by a control signal 167. An output of the latch 162 is input to an AND gate 163. A clock output 161 is also input to the AND gate 163 from the reference clock generating circuit 113. An output of the AND gate 163 is input to the microprocessor circuit B as a system clock 164. Accordingly, the system clock 164 may be stopped by writing to the latch 162, putting the microprocessor circuit B into a so-called HALT state.

The microprocessor may be thus put into the halt state at times when it is not necessary by gating the system clock, allowing the system to suppress power consumption.

In FIG. 37, a serial data is input to the synchronizing circuit 132 from outside of the receiving apparatus via a serial data input terminal 131. When synchronism is established by the synchronizing circuit 132, the data is acquired in succession. The acquired data is corrected as necessary by the error correction circuit 133 and it is determined if its ID coincides with a specified ID or not by the ID collating circuit 134. When it is confirmed that the IDs coincide, an interrupt generated by an interrupt request signal 169 is output to the microprocessor circuit B and a message is received in succession. Errors in the received message are corrected similarly to the case of the IDs. The microprocessor circuit B becomes ready to receive the message by receiving an interrupt request and acquires the received message whose errors have been corrected.

With the recent widespread dissemination of radio communication systems and the diversification of communication services, the number of IDs assigned to portable radio terminals is likely to increase year by year. Thus, terminals which can accommodate flexibly the diversification of communication systems and communication services will be required along the liberalization of the communication systems and communication services for the future.

However, when the number of ID codes assigned to the terminal increases, the prior art serial data receiving apparatuses described above require an increase in the number of registers or an increase in the operation clock of the microprocessor circuit B for the collation.

The collation of ID codes normally permits an error of several bits, not requesting a total coincidence. Due to that, the collation by means of software requires a large number of complicated steps. Accordingly, it becomes necessary to increase the clock speed of the microprocessor circuit B in order to collate ID codes while receiving serial data simultaneously. However, there has been a problem in such a case in that the power consumption increases and the receiving sensitivity drops due to noises generated.

Meanwhile, there have been problems in the correlation of ID codes by hardware in that it costs more due to the increase in the size of the hardware and that it lacks flexibility.

Because a syndrome indicates a position of an error bit for one-bit error generated in the received data, the error in the received data may be corrected by a relatively simple circuit. FIG. 11 shows a relationship between error bit positions and syndromes (syndrome vector patterns) when data of 31 bits is received.

In addition, when a two-bit error in received data is to be corrected, it is possible to prepare a pattern which can indicate two error bit positions by taking an exclusive OR of two corresponding syndrome vector patterns per each bit when the error is generated in each bit.

However, there is a problem in that the circuit size of the decoder becomes extremely large because it requires 31×30×½ patterns, i.e. 465 types of patterns in the case of 31 bits for example.

Accordingly, it is an object of the invention to provide a data processing unit which allows the correction of a 2-bit error in the received data without increasing the circuit size remarkably.

The prior art circuit has had problems in that it requires N clock pulses for checking every time 1 bit is acquired, and thus requires many circuit operations to detect a word boundary, which increases its power consumption due to signal changes caused by the pulses and it shortens a life of a battery especially when it is used for a portable device. Accordingly, it is an object of the present invention to provide a data processing unit which is adapted to be able to determine and correct errors continuously with less circuit operations, i.e. with less power consumption. It would be impossible to accommodate the increase of a number of necessary IDs if one tried to accommodate a large number of services by using a prior art serial data receiving apparatus. For example, there is a possibility that a contracted ID differs depending on service offerers in receiving services of a plurality of different service offerers by roaming for example. Although it is possible to increase a number of ID registers for example to have many IDs to deal with that, has increases the cost of the equipment because of the increase of the hardware. Due to that, it cannot be increased limitlessly.

But, if all IDs are to be stored in the RAM and are to be collated by a micro-controller, it will not suited for a portable battery-powered device because the power consumption increases.

Further, it has been necessary to stop to receive data once in the past in rewriting IDs when it should be done. Accordingly, there has been a problem in that the receiving has to be stopped once when a service of rewriting an ID in conformity with a code received from a service offerer is to be begun for example. Accordingly, it becomes necessary to start all over again from the establishment of the synchronism in starting again. This increases the probability of received data during the rewriting of the ID.

In the prior art serial data receiving apparatus, the microprocessor circuit B is put into an operative state even in the midst of receiving data when data is stored in the register circuit 139. When the microprocessor circuit B receives an interrupt request from the decoder circuit A, it has to acquire the content of the register circuit 139 before data to be received in succession is written into the register circuit 139 especially in the system not using the DMA. Accordingly, there has been a problem in that if the system clock of the microprocessor circuit B is increased, the power consumption increases and the receiving sensitivity drops due to noises generated.

However, when the number of ID codes assigned to the terminal increases, the prior art serial data receiving apparatuses described above require an increase in the number of registers or an increase in the operation clock speed of the microprocessor circuit B for the collation.

The collation of ID codes normally permits an error of several bits, not requesting a total coincidence. Due to that, the collation by means of software requires a large number of complicated steps. Accordingly, it is necessary to increase the clock speed of the microprocessor circuit B in order to collate ID codes while receiving serial data simultaneously. However, there has been a problem in such a case in that the power consumption increases and the receiving sensitivity drops due to noises generated.

Meanwhile, there have been problems in the correlation or collation of ID codes by hardware in that it costs more due to the increase in the size of the hardware and that it lacks a flexibility.

However, when the number of ID codes assigned to the terminal increases, the prior art serial data receiving apparatuses described above require an increase in the number of registers or an increase in the operation clock speed of the microprocessor circuit B for collation.

The collation of ID codes normally permits an error of several bits, not requesting a total coincidence. Due to that, the collation by means of software requires a large number of complicated steps. Accordingly, it is necessary to increase the clock speed of the microprocessor circuit B in order to collate ID codes while receiving serial data simultaneously. However, there has been a problem in such a case in that the power consumption increases and the receiving sensitivity drops due to noises generated.

Meanwhile, there have been problems in collating ID codes by hardware that it costs more due to the increase of the size in the hardware in and that it lacks a flexibility.

Then, it is conceivable to include a minimum necessary hardware for collating IDs and to compare received ID code with corresponding bits of an assigned ID code per one bit. This method allows a reduced cost, a reduced clock speed and increased flexibly. However, it has had a problem in that along with the increase of bit rate in the received data, a burden on the software increases and the system clock speed is required to be increased.

SUMMARY OF THE INVENTION

A first object of the present invention is to provide a receiver including a data processing unit for correcting errors in received data encoded by a cyclic redundancy check code, comprising a data holding section for holding the received data; a checking section for generating and outputting a syndrome in response to the received data and in accordance to the cyclic redundancy check code; a storage section for storing reference syndrome patterns obtained from an exclusive OR of all syndrome patterns when a 1-bit error exists in the received data and a syndrome pattern when an error exists in the most significant bit data of the received data per bit; and a comparison section for outputting an indication of a coincidence when the output data coincides with any one of the reference syndrome patterns in response to an output data from the checking section; the output of the data holding section being corrected when the indication of the coincidence is output from the comparison section.

A second object of the present invention is to provide a receiver including a data processing unit for determining errors in bit serial input data by using a cyclic redundancy check code, comprising a data register capable of holding input data of bits which is equivalent to a sum of a predetermined data length and the cyclic redundancy check code; and a checking circuit for generating a syndrome from the input data in accordance to the cyclic redundancy check code; a level of the input data input to the checking circuit being reversed in accordance to the oldest data in the data register.

A third object of the present invention is to provide a receiver including a serial synchronous receiving apparatus having bit synchronizing means, word synchronizing means, ID storage means, ID collating means, an oscillation circuit, a timing generating circuit, a timer counter and state control means, the state control means for controlling a plurality of receiving modes.

A fourth object of the present invention is to provide a receiver including a serial data receiving apparatus, comprising a decoder circuit having a synchronizing circuit, an ID collating circuit, an error correcting circuit and a control circuit; and a microprocessor circuit having a CPU core circuit, a program ROM and a data RAM connected to the decoder circuit by data buses, address buses and a plurality of signal lines; received data and data accompanying to the received data being stored from the decoder circuit to an area specified in advance in a memory space including the data RAM of the microprocessor circuit regardless of a program executed by the CPU core circuit.

A fifth object of the present invention is to provide a receiver including a serial data receiving apparatus, comprising a decoder circuit having a synchronizing circuit, an ID collating circuit, an error correcting circuit and a control circuit; and a microprocessor circuit having a CPU core circuit, a program ROM and a data RAM connected to the decoder circuit by data buses, address buses and a plurality of signal lines; received data and data accompanying to the received data being stored from the decoder circuit to an area specified in advance in a memory space including the data RAM of the microprocessor circuit by switching the address bus and data bus with a cycle timing of a fetch command of the CPU core circuit.

A sixth object of the present invention is to provide a receiver including a serial data receiving apparatus controlled by a selected paging signal (hereinafter referred to as ID) for acquiring data in synchronism with serial data transmitted through a communication channel characterized in that when it receives the ID code, it collates each bit of the received ID code sequentially by comparing one selected bit within the ID code with a corresponding bit of a plurality of ID codes assigned to the receiving apparatus simultaneously in parallel and by selecting a next bit of the received ID code in succession.

A seventh object of the present invention is to provide a receiver including a serial data receiving apparatus, comprising a microprocessor circuit including a serial data input terminal, a reference clock generating circuit and a central processing unit (hereinafter referred to as CPU); a synchronizing circuit connected with the serial data input terminal and the reference clock generating circuit for synchronizing signals from the serial data input terminal by clocks output from the reference clock generating circuit; a register circuit connected with the synchronizing circuit and the microprocessor circuit and whose setting is made by the microprocessor circuit and whose setting is released by an output signal from the synchronizing circuit; and a gate circuit, connected with the register circuit, the reference clock circuit and the microprocessor circuit, for controlling supply of system clocks output by the reference clock generating circuit to the microprocessor circuit by gating the system clock by an output of the register circuit; a processing program of the microprocessor circuit being executed in synchronism with each bit of the serial data.

In order to solve the aforementioned problems, the present invention is characterized in that the data processing unit for correcting errors in received data encoded by a cyclic redundancy check code comprises the data holding section for holding the received data; the checking section for generating and outputting a syndrome in response to the received data and in accordance to the cyclic redundancy check code; the storage section for storing reference syndrome patterns obtained from an exclusive OR of all syndrome patterns when 1-bit error exists in the received data and a syndrome pattern when an error exists in the most significant bit data of the received data per bit; and the comparison section for outputting an indication of a coincidence when the output data coincides with any one of the reference patterns in response to an output data from the checking section, and that the output of the data holding section is corrected when the indication of the coincidence is output from the comparison section.

In order to solve the aforementioned problems, the apparatus of the present invention utilizes such facts that a syndrome returns to the same value when modulo-two arithmetics to 0 are carried out by a bit number of one word and that the syndrome becomes 1 when an error bit is the most front data. It is characterized in that a data processing unit for determining errors in bit serial input data by using the cyclic redundancy check code comprises the data register for holding input data of bits which is equivalent to a sum of a predetermined data length and the cyclic redundancy check code and a checking circuit for generating a syndrome from the input data in accordance to the cyclic redundancy check code and that a level of the input data input to the checking circuit is reversed in accordance to the oldest data in the data register.

In order to solve such shortcoming of the prior art as described above, the present invention is adapted so as to be able to rewrite IDs in a sufficiently short time while holding the synchronism by setting a PAUSE mode by the state control means, in addition to a timer and receiving mode (RUN mode) of the prior art receiving apparatus.

In order to solve such shortcoming of the prior art as described above, the present invention is adapted so as to store received data and data accompanying to the received data from the decoder circuit to an area specified in advance within a memory space including a data RAM of a microprocessor circuit regardless of a program executed by the CPU core circuit.

In order to solve such shortcoming of the prior art as described above, the present invention realizes a low cost flexible receiving apparatus which can process with low-speed clocks by including a minimum necessary hardware for collating IDs to compare a received ID with a bit of corresponding ID code assigned in advance per bit.

In order to solve such shortcoming of the prior art as described above, the present invention allows processing per bit without any interrupt process by activating the system clock of the microprocessor in synchronism with each bit of received data.

Received data which is data to be checked is held in the data holding section. A syndrome is generated and outputted from the checking section based on the held received data and in accordance to the CRC code. When output data which is the syndrome outputted thus from the checking section coincides with any one of reference syndrome patterns, an indication of coincidence is output from the comparison section and in response to the indication of coincidence, the output of the data holding section is corrected.

Thereby, the influence of bits shifted out in the data register is canceled one by one and the syndrome for the data currently held in the data register may be found without calculating the syndrome each time.

That the syndrome becomes 1 when an error bit comes to the most front even though the modulo-two arithmetic is performed by setting an input of the checking circuit at 0 means that 1 comes in due to the innermost data of the syndrome. Because this data of 1 is caused by the innermost data in the data register, the influence given when the data is acquired first may be canceled by causing an exclusive OR with the innermost data of the syndrome to affect the most front syndrome by the value of the data register.

In the serial data receiving apparatus constructed as described above, both a timer function and a data receiving function are performed at the same time in the normal RUN mode. When no data is received, its power consumption can be remarkably reduced by putting its mode into a STOP mode, while maintaining the timer function. In the PAUSE mode, no IDs are collated, so that IDs can be rewritten while maintaining the timer function and the synchronous state. Due to that, even if ID is changed due to roaming or the like, the same service may be received continuously by rewriting it at each time.

In the serial data receiving apparatus constructed as described above, when the decoder circuit detects data to be received by collating IDs, it receives it and stores in the data RAM. It is stored so that the timing in storing it exerts no effect to the execution of commands of the CPU core circuit and others. Because a storage area in the RAM is specified in advance, the microprocessor circuit can operate without being influenced by the decoder circuit at all if it executes a program while avoiding that area. Further, because the access from the decoder circuit to the data RAM is performed independently, it is not necessary for the microprocessor circuit to operate at high-speed to store data in receiving the data. As a result, a low power consumption and low noise serial data receiving apparatus as a portable equipment may be realized, increasing a life of a battery thereof and enhancing the receiving sensitivity thereof.

In the serial data receiving apparatus constructed as described above, the decoder circuit collates IDs in unit of bit for data successively input after synchronizing the serial data input and correcting errors. The collation of the IDs is carried out by the comparison circuit by comparing the received bit sequentially with a head bit of a plurality of assigned reference ID codes. Because the reference IDs input to the comparison circuit are stored in the RAM of the microprocessor in advance, it may be freely increased/decreased. Further, because the comparison is made by transferring data from the RAM every time when one bit is received, clocks of several to several ten times of bit rate will suffice.

The receiving operation may be facilitated by storing the plurality of reference IDs in the RAM by converting from serial to parallel. It allows the comparison of the received bit with a corresponding bit of the plurality of reference IDs by one time of data transfer from the RAM to the comparison circuit.

In the serial data receiving apparatus constructed as described above, when it is necessary to collate received serial data, a HALT command is executed after finishing the pre-processing, putting into a HALT state at a head of a necessary processing routine. When a synchronism has been established, the HALT state is released every time when one bit is received and necessary processing is carried out automatically. For example, IDs are collated in unit of bit for input data. The collation of the IDs is carried out by the comparison circuit by comparing the received bit sequentially with a head bit of a plurality of assigned reference ID codes. Because the reference IDs input to the comparison circuit are stored in the RAM of the microprocessor in advance, it may be freely increased/decreased. Further, the comparison is made by transferring data from the RAM every time when one bit is received. The HALT state of the microprocessor is released normally by an interrupt. Accordingly, it may be released by generating the interrupt every time when one bit is received. However, a normal microprocessor needs a pre-processing of about 5 machine cycles to enter the interrupt processing. By the way, a number of steps actually needed for the collation of IDs is almost equal or slightly more than this interrupt pre-processing. Due to that, the elimination of the interrupt pre-processing contributes to the reduction of frequency of the system clock and to the decrease of the power consumption.

The receiving operation may be facilitated by storing the plurality of reference IDs in the RAM by converting from serial to parallel. It allows the comparison of the received bit with a corresponding bit of the plurality of reference IDs by one time of data transfer from the RAM to the comparison circuit.

BRIEF DESCRIPTION OF THE DRAWINGS

FIG. 11 is a chart showing a corresponding relationship between error bit positions and syndrome vector patterns for a case of 31-bit receiving data;

DETAILED DESCRIPTION OF PREFERRED EMBODIMENTS

Figure 1:
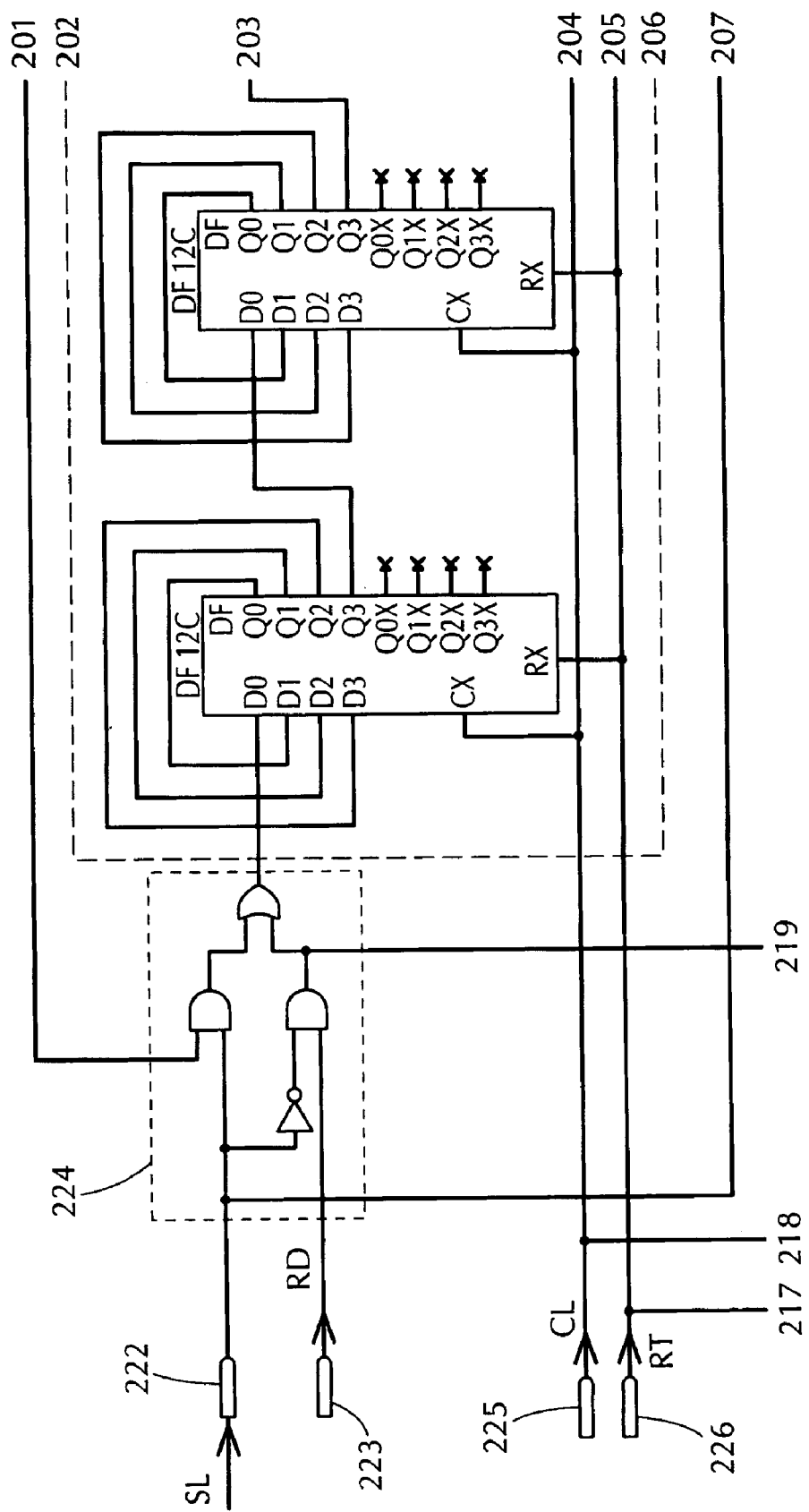
FIG. 1 is a circuit diagram showing one embodiment of a data processing unit of the present invention.
Figure 2:
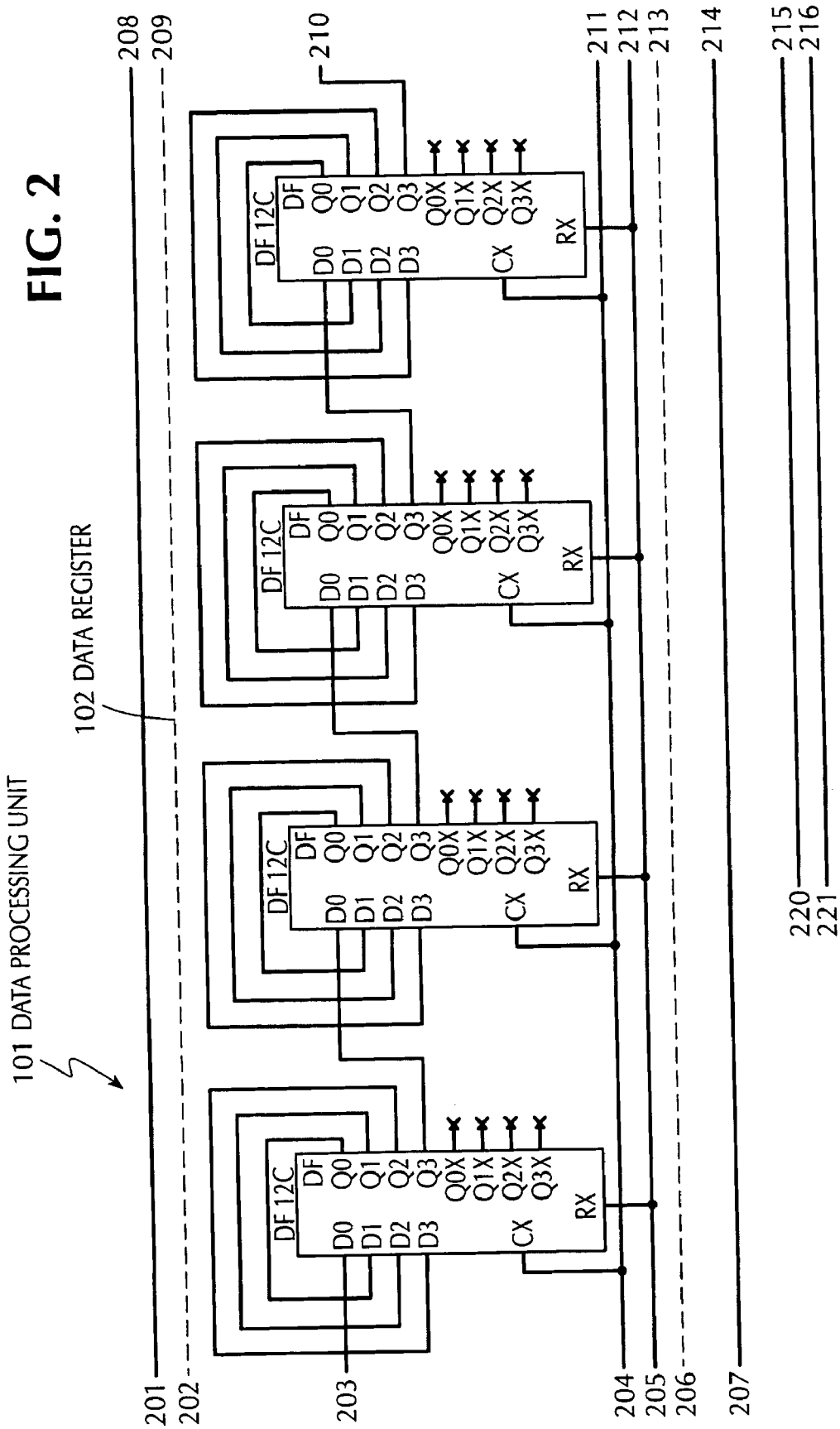
FIG. 2 is a circuit diagram showing one embodiment of the data processing unit of the present invention.
Figure 3:
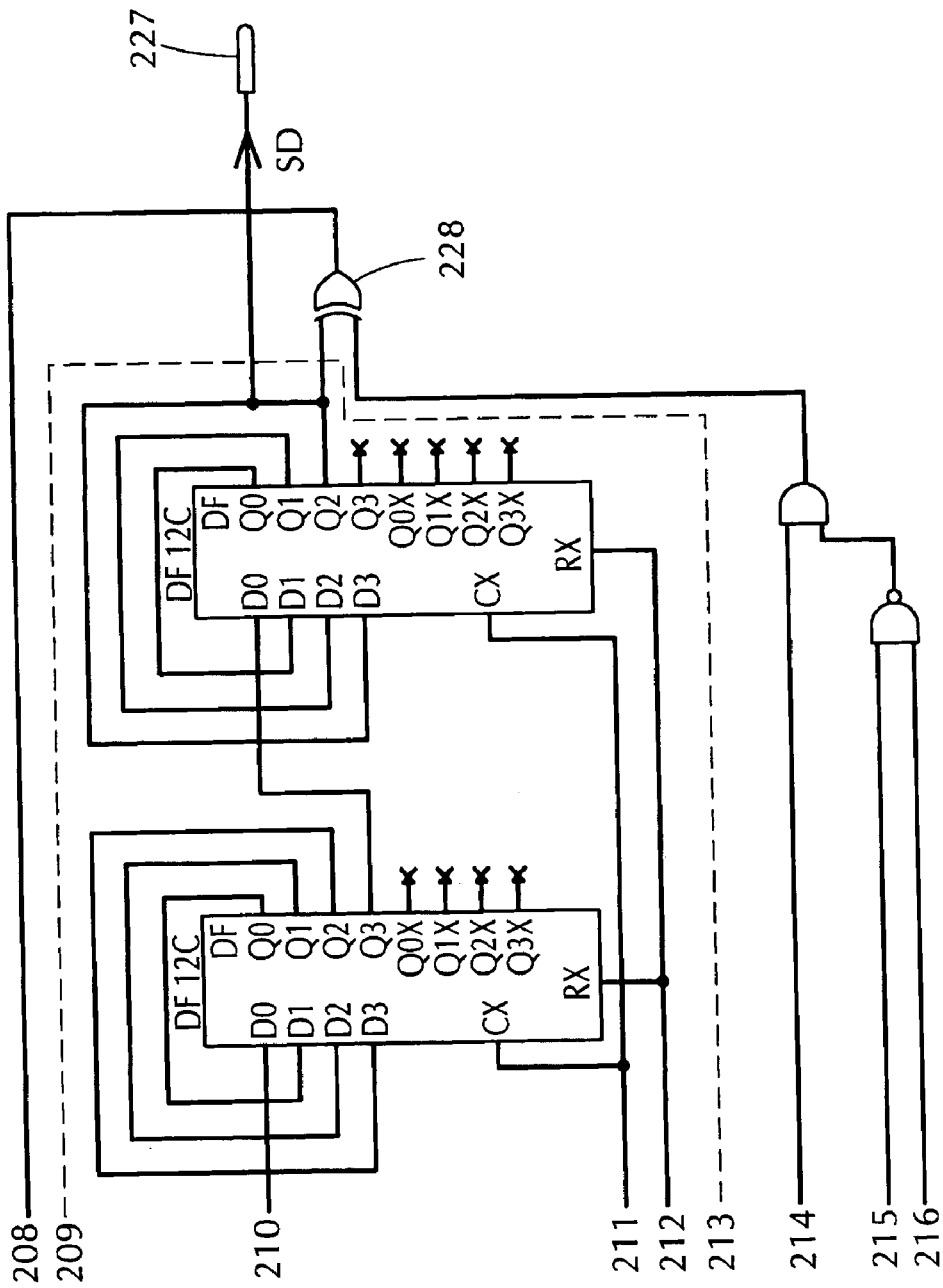
FIG. 3 is a circuit diagram showing one embodiment of the data processing unit of the present invention.
Figure 4:
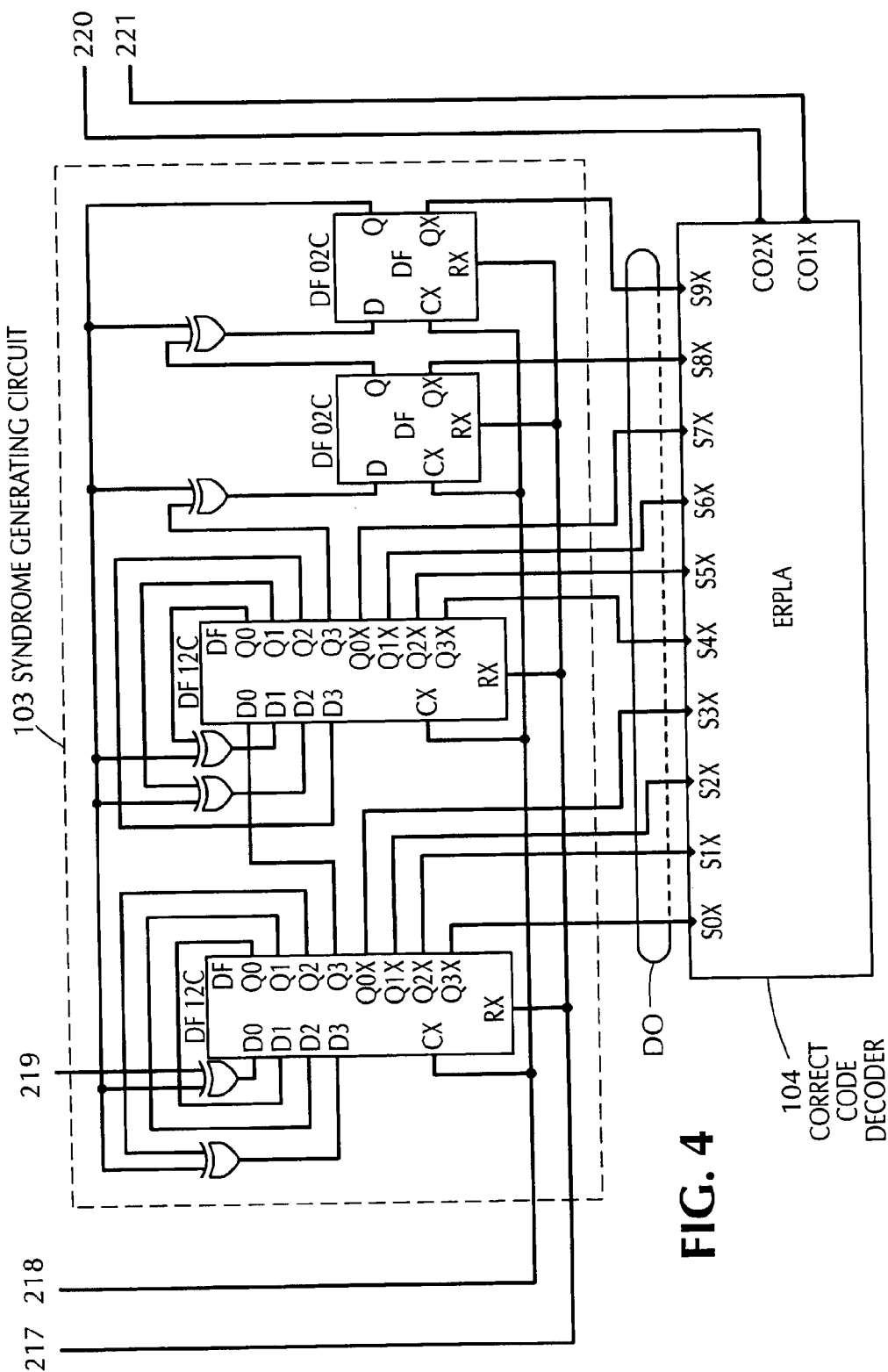
FIG. 4 is a circuit diagram showing one embodiment of the data processing unit of the present invention.
Figure 5:
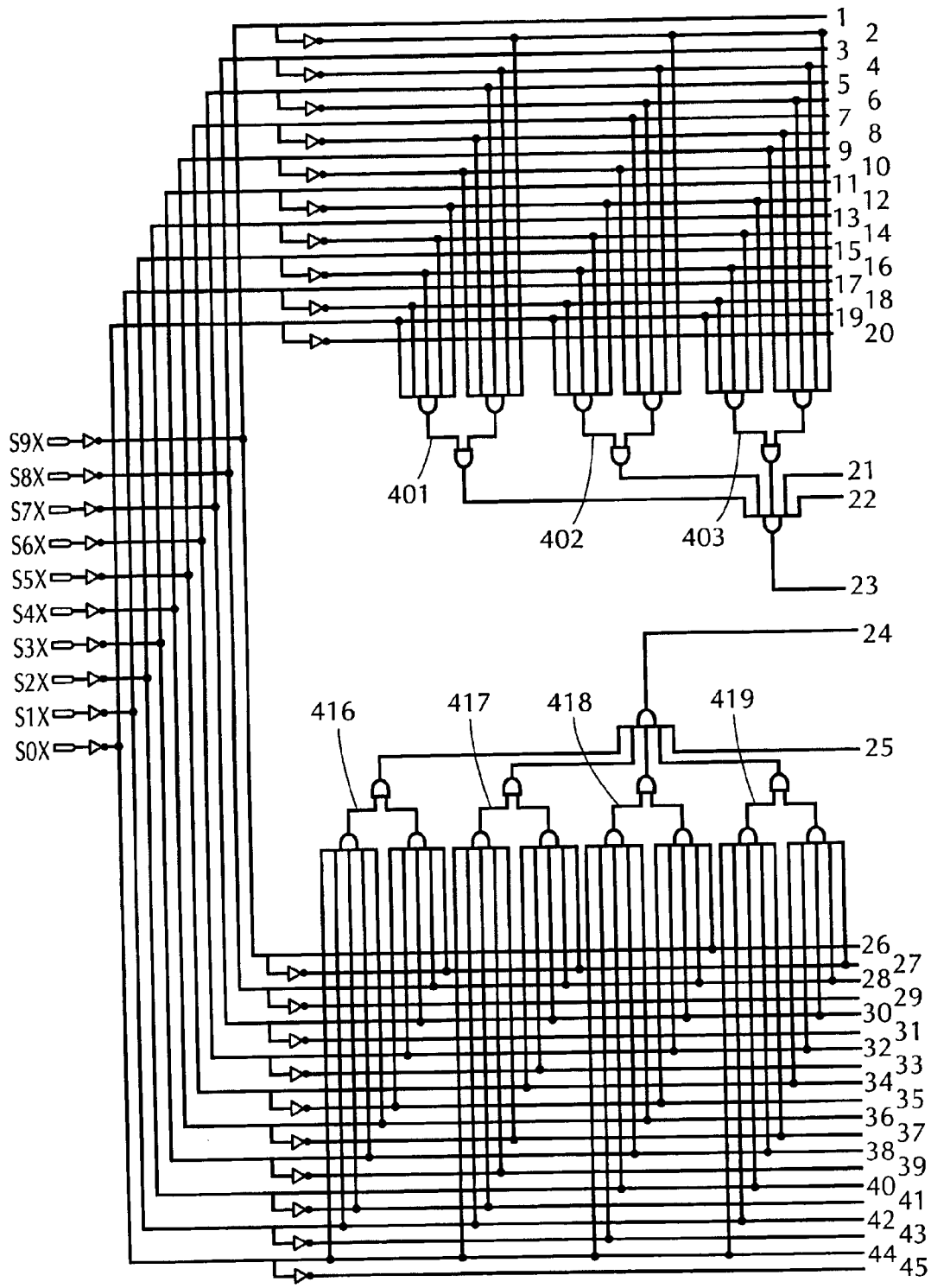
FIG. 5 is a detailed circuit diagram of a correction code decoder in FIGS. 1 through 4.
Figure 6:
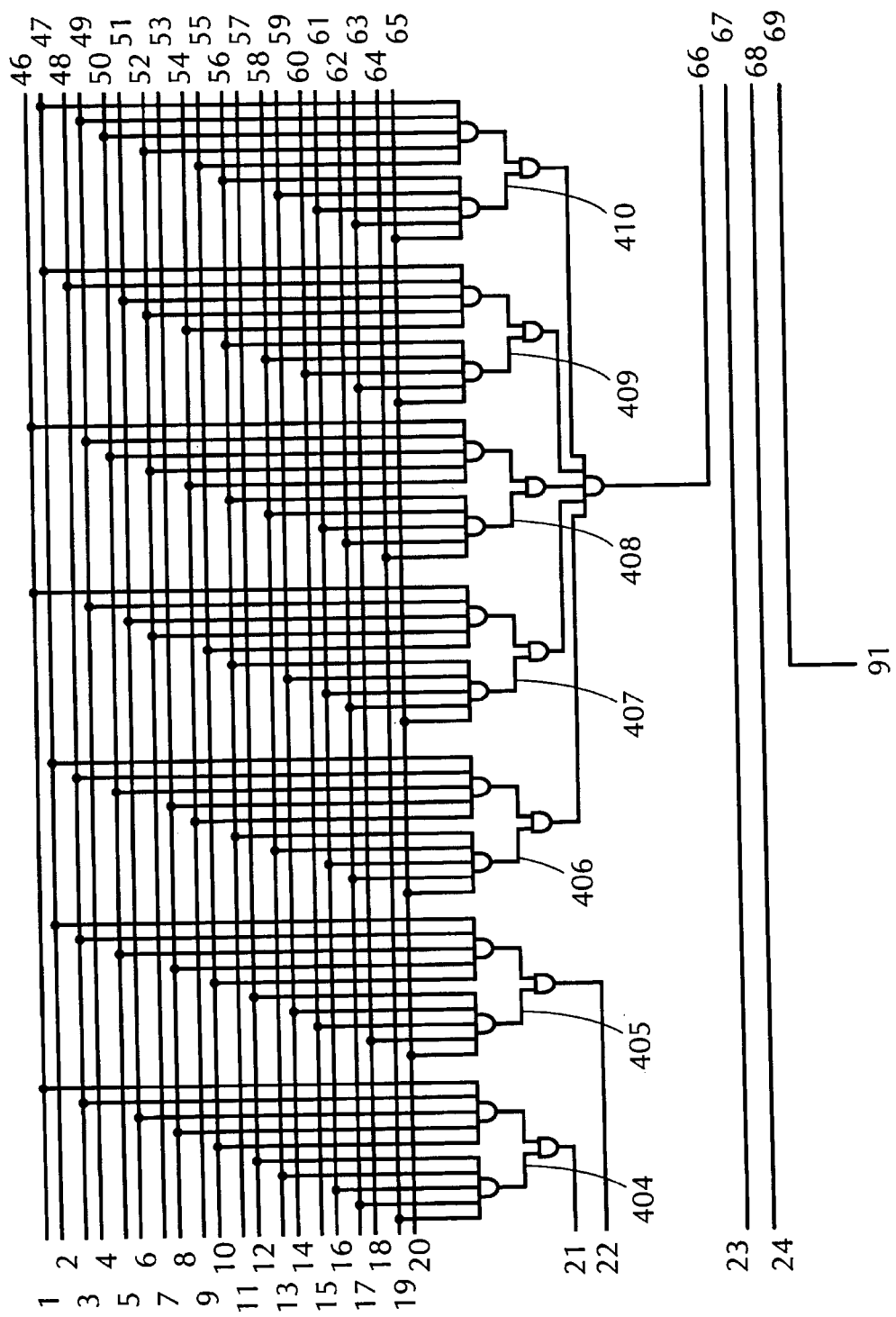
FIG. 6 is a detailed circuit diagram of the correction code decoder in FIGS. 1 through 4.
Figure 7:
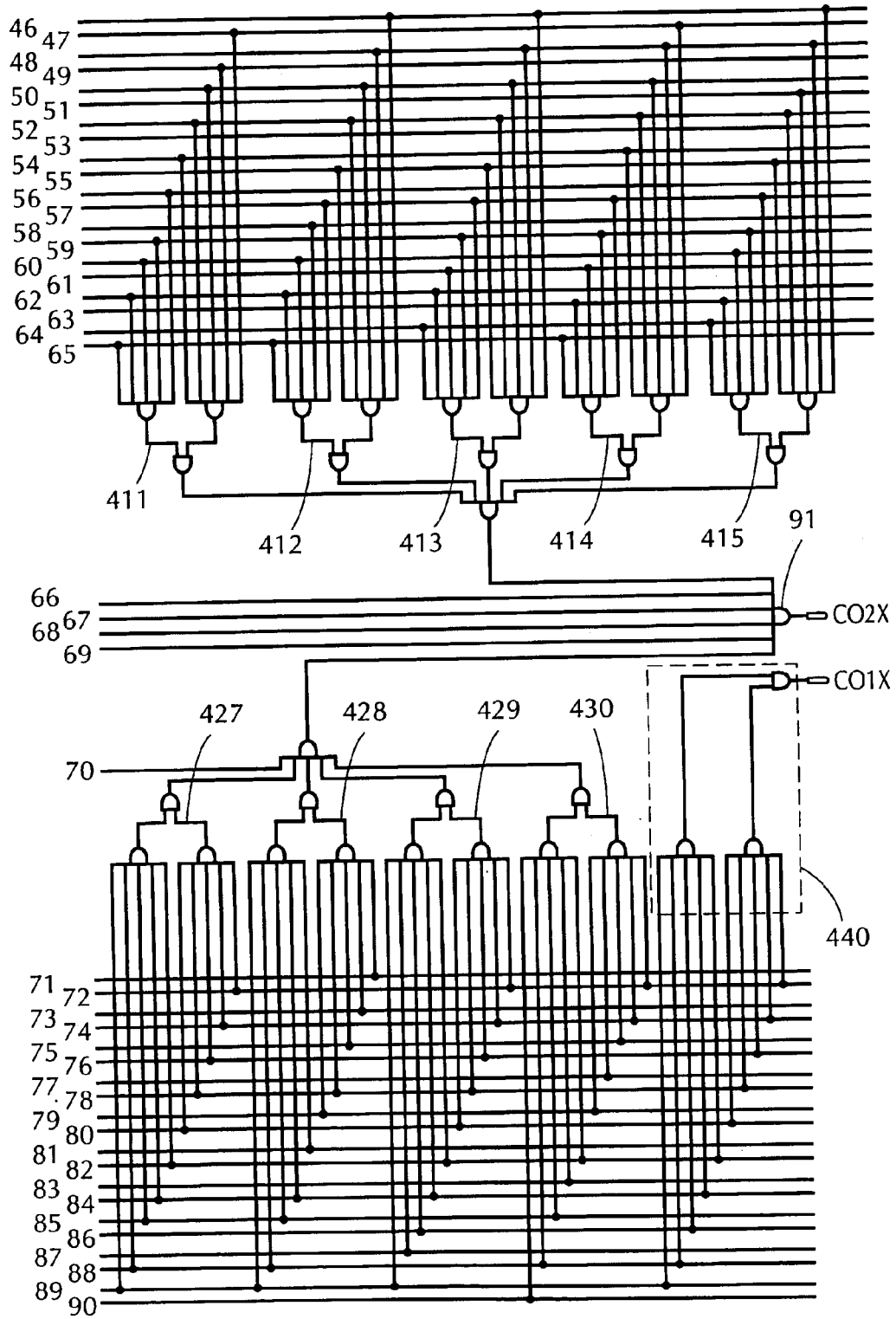
FIG. 7 is a detailed circuit diagram of the correction code decoder in FIGS. 1 through 4.
Figure 8:
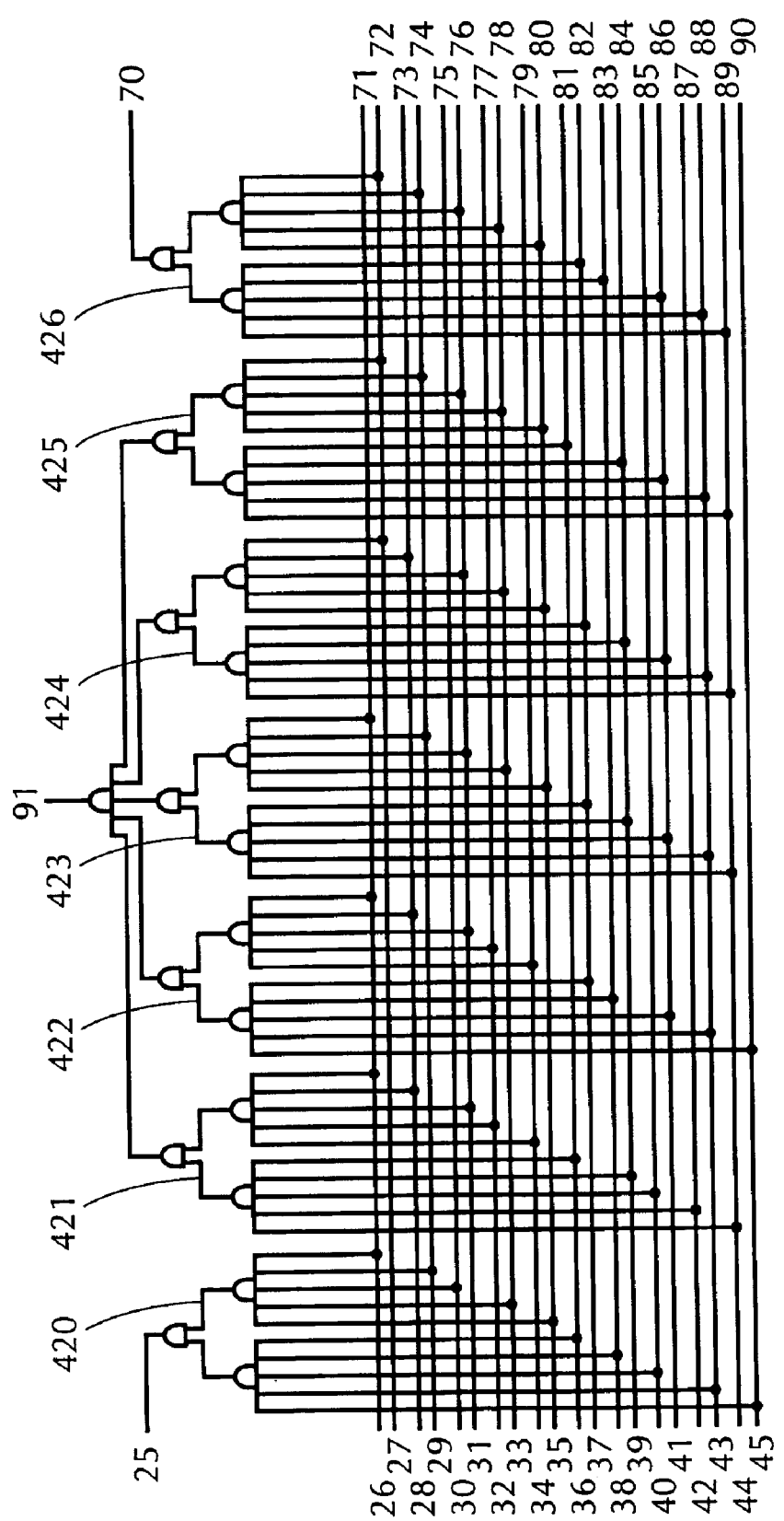
FIG. 8 is a detailed circuit diagram of the correction code decoder in FIGS. 1 through 4.

One preferred embodiment of the present invention will be explained in detail with reference to the drawings.

FIGS. 1 through 4 are circuit diagrams showing one embodiment of a data processing unit of the present invention. A data processing unit 101 implements a two-bit error correction process on received data RD input from an input terminal 223 and encoded by a CRC code and outputs corrected received data SD whose errors have been corrected from an output terminal 227. The data processing unit 101 may be used as a circuit for correcting data error of a paging decoder using a POCSAG method for example.

The data processing unit 101 comprises a data register 102, a syndrome generating circuit 103 and a correction code decoder 104.

The data register 102 is structured as a shift register circuit having a known structure for holding received data RD of 31 bits input from the input terminal 223. An exclusive OR gate 228 corrects an output of the data register 102 as necessary as described later and sends it to the input side of the data register 102 again and a switching circuit 224 selectively supplies either an output from the exclusive OR gate 228 or the received data RD to the input terminal of the data register 102 depending on a selection control signal SL supplied to a terminal 222. Note that clock pulses CL supplied from a clock input terminal 225 are supplied to the data register 102 and thereby the data from the switching circuit 224 is held there by being shifted per bit.

The received data RD is supplied to the syndrome generating circuit 103 via the switching circuit 224. The syndrome generating circuit 103 implements modulo-two arithmetics on the received data RD and finds residues of the arithmetics. The syndrome generating circuit 103 also operates in response to the clock pulses CL and generates and outputs the residues, i.e. syndromes, found when it implements the arithmetics on all bits. The syndrome thus obtained is input to the correction code decoder 104 as an output data DO of the syndrome generating circuit 103.

A reset signal RT is input from a reset signal input terminal 226 and the data register 102 and the syndrome generating circuit 103 are reset in response to a predetermined change of the level of the reset signal RT.

The correction code decoder 104 has input terminals S0X through S9X for inputting the output data DO which is 10 bit parallel data and has a function of outputting an instruction to correct data when the content of the output data DO coincides with a plurality of predetermined codes. In the present embodiment, two output terminals CO1X and CO2X are provided for outputting the instruction to correct data. The output terminal CO1X turns to "H" level in response to a syndrome wherein an error within the data held in the data register 102 exists in the oldest data stored in the data register 102. Meanwhile, the output terminal CO2X turns to "H" level in response to syndromes when data errors exist in two data, in the oldest data and in another arbitrary data stored in the data register 102, i.e. in response to 30 types of syndromes in total. Such syndromes may be discriminated by using a logical discrimination circuit. FIGS. 5 through 8 show structural examples of a concrete circuit when the correction code decoder 104 is constructed for that end.

In FIGS. 5 through 8, it is determined whether the content of the output data DO comprising 10 bits is pertinent to any one of 30 types of syndromes when data errors exist at two data, the oldest data stored in the data register 102 and another arbitrary data, by using the logical discrimination circuits 401 through 430, and when it is pertinent to any one of the syndrome generating circuit 30 types of syndromes, an OR gate 91 is opened and the level of the output terminal CO2X turns to "H" indicating that they coincide.

Meanwhile, a logical discrimination circuit 440 determines whether the output data DO at that time is pertinent to the syndrome when an error exists within the oldest data stored in the data register 102, and when it is pertinent to the syndrome, the level of the output terminal COX1 turns to "H" indicating that they coincide.

Figure 9:
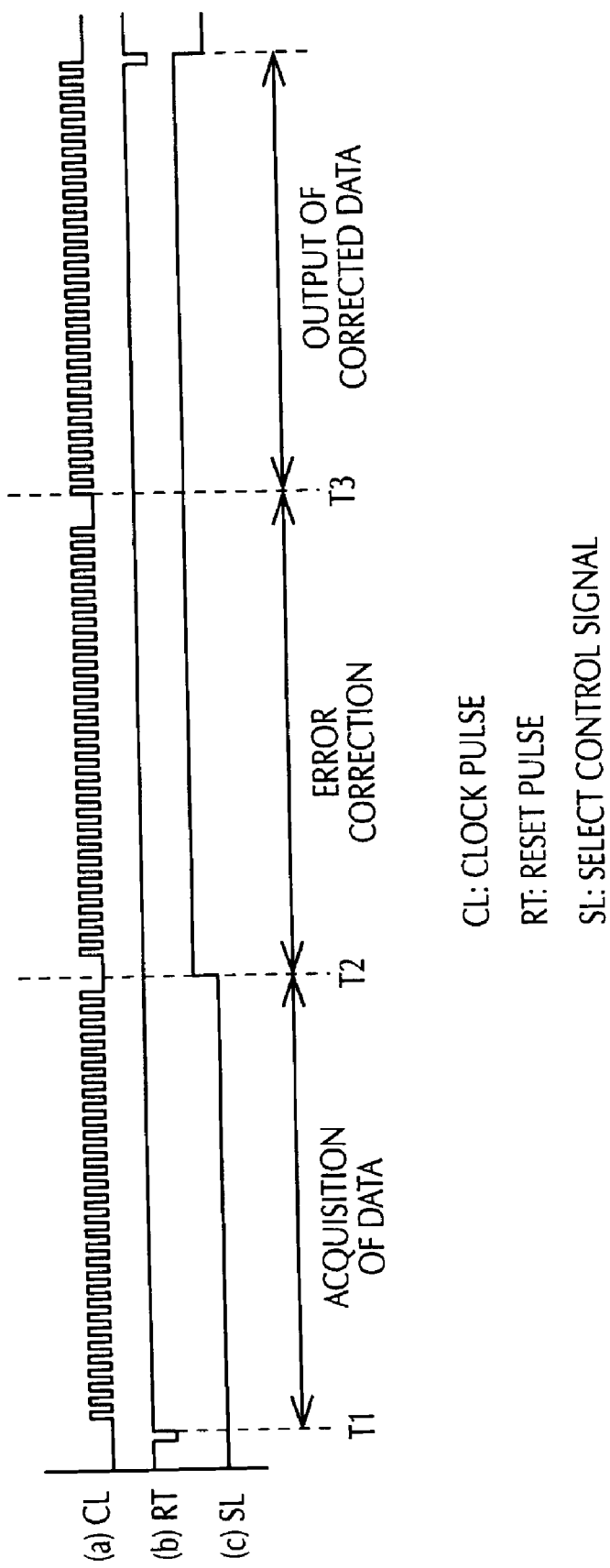
FIG. 9 is a signal waveform chart of each part for explaining operations of the data processing unit in FIGS. 1 through 4.
Figure 10:
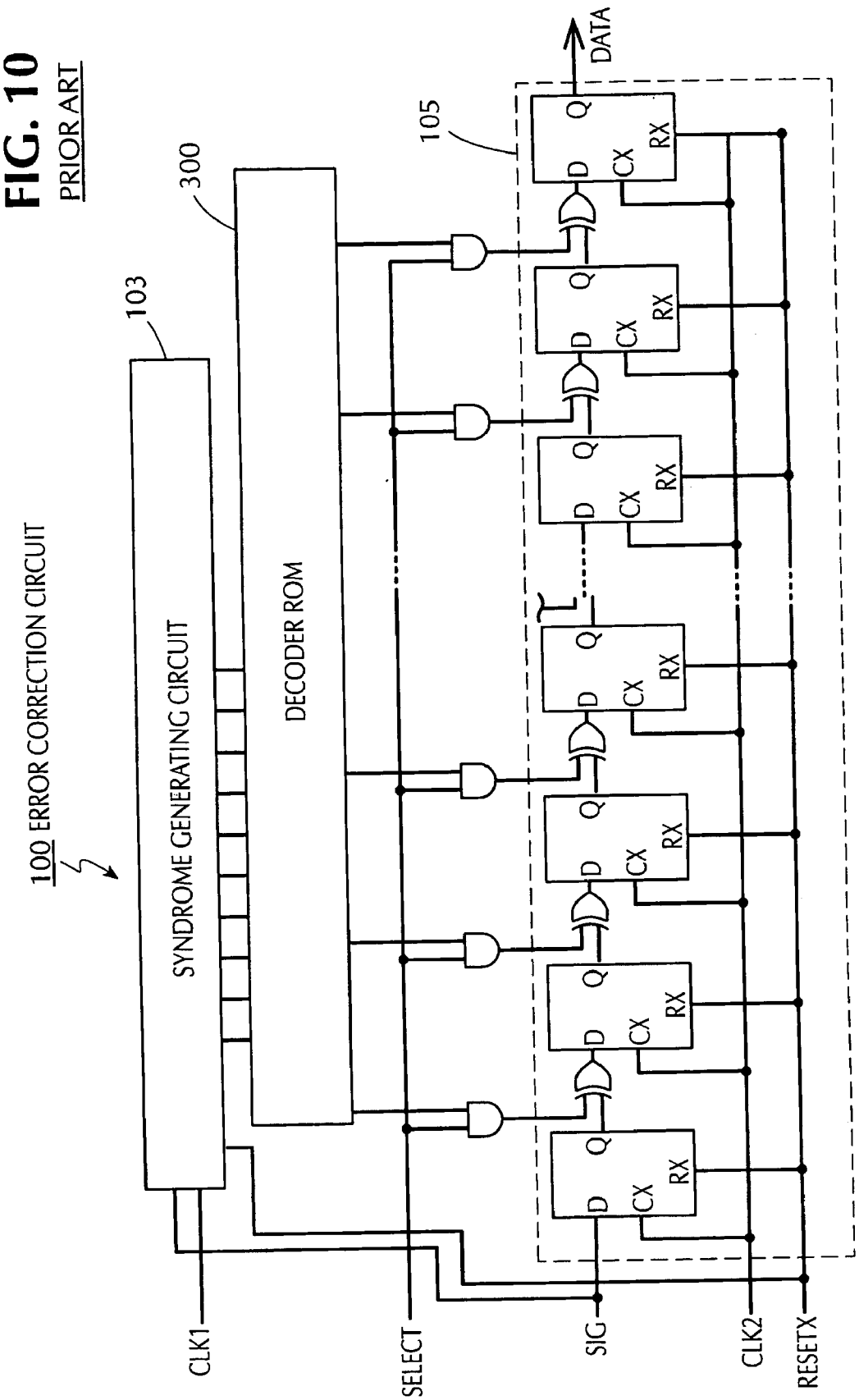
FIG. 10 is a circuit diagram showing a prior art error correction circuit for correcting a one-bit error.
Figure 12:
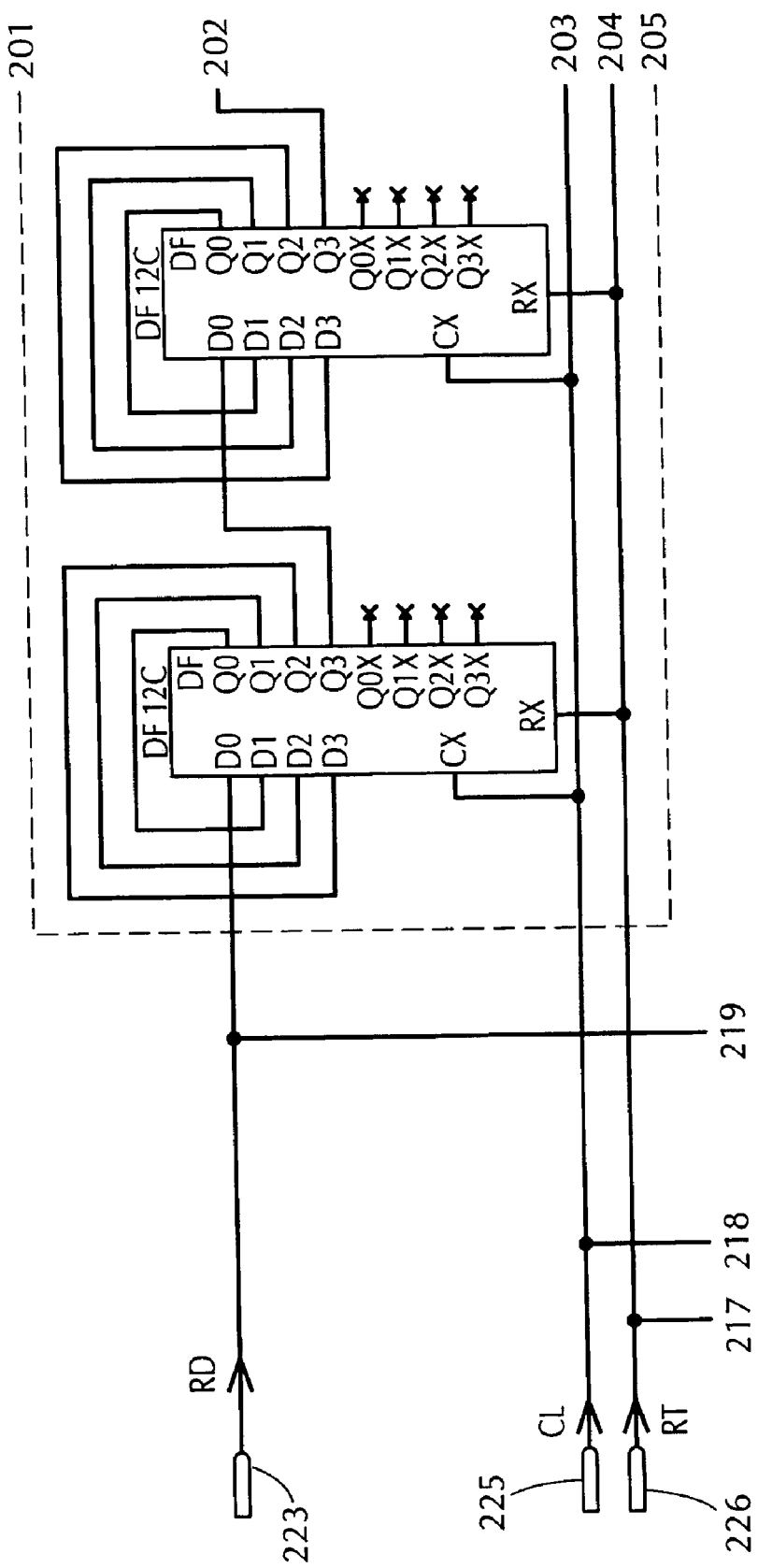
FIG. 12 is a circuit diagram showing one embodiment of the data processing unit of the present invention.
Figure 13:
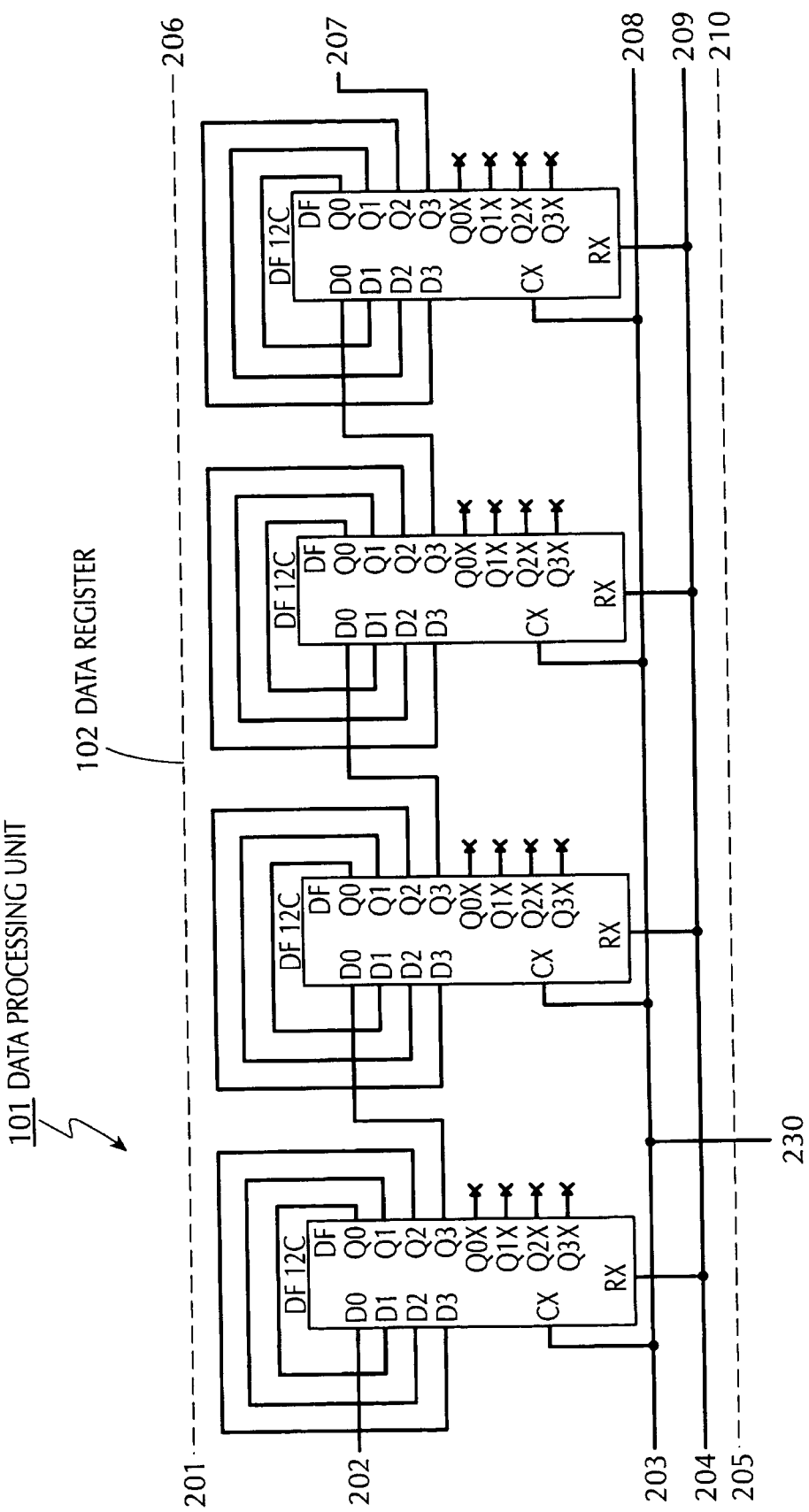
FIG. 13 is a circuit diagram showing one embodiment of the data processing unit of the present invention.
Figure 14:
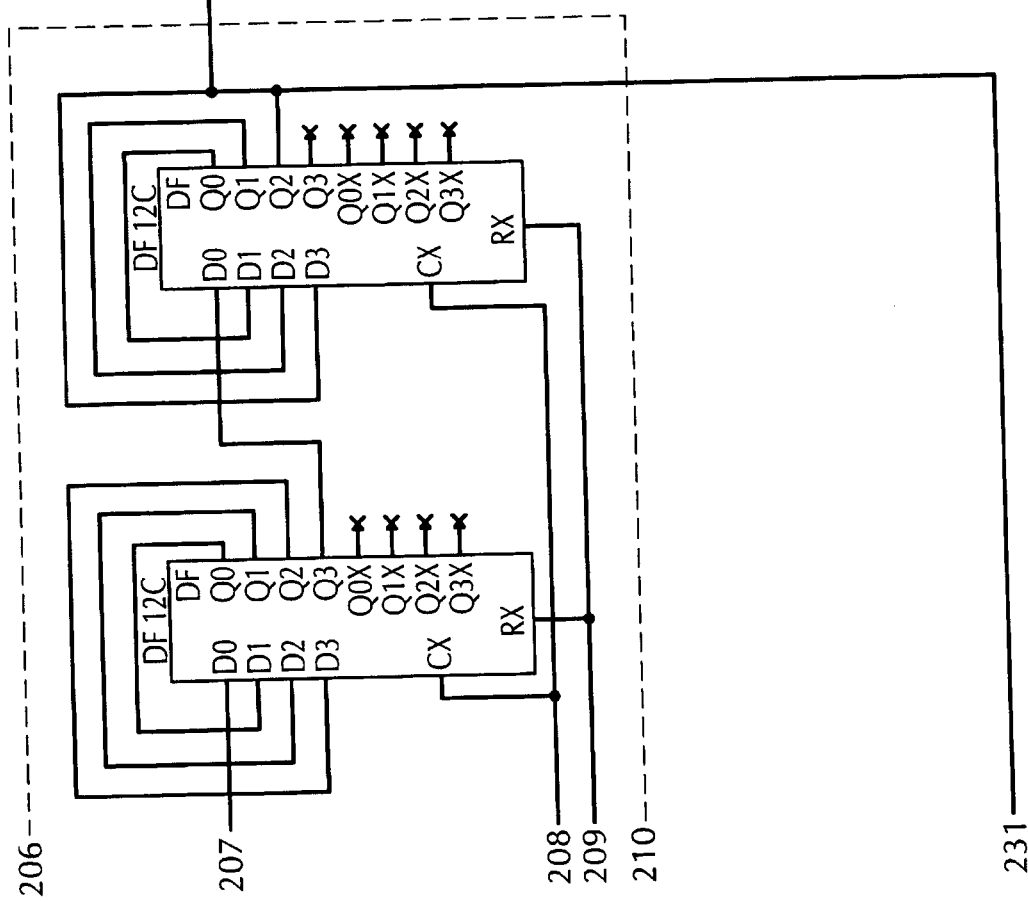
FIG. 14 is a circuit diagram showing one embodiment of the data processing unit of the present invention.
Figure 15:
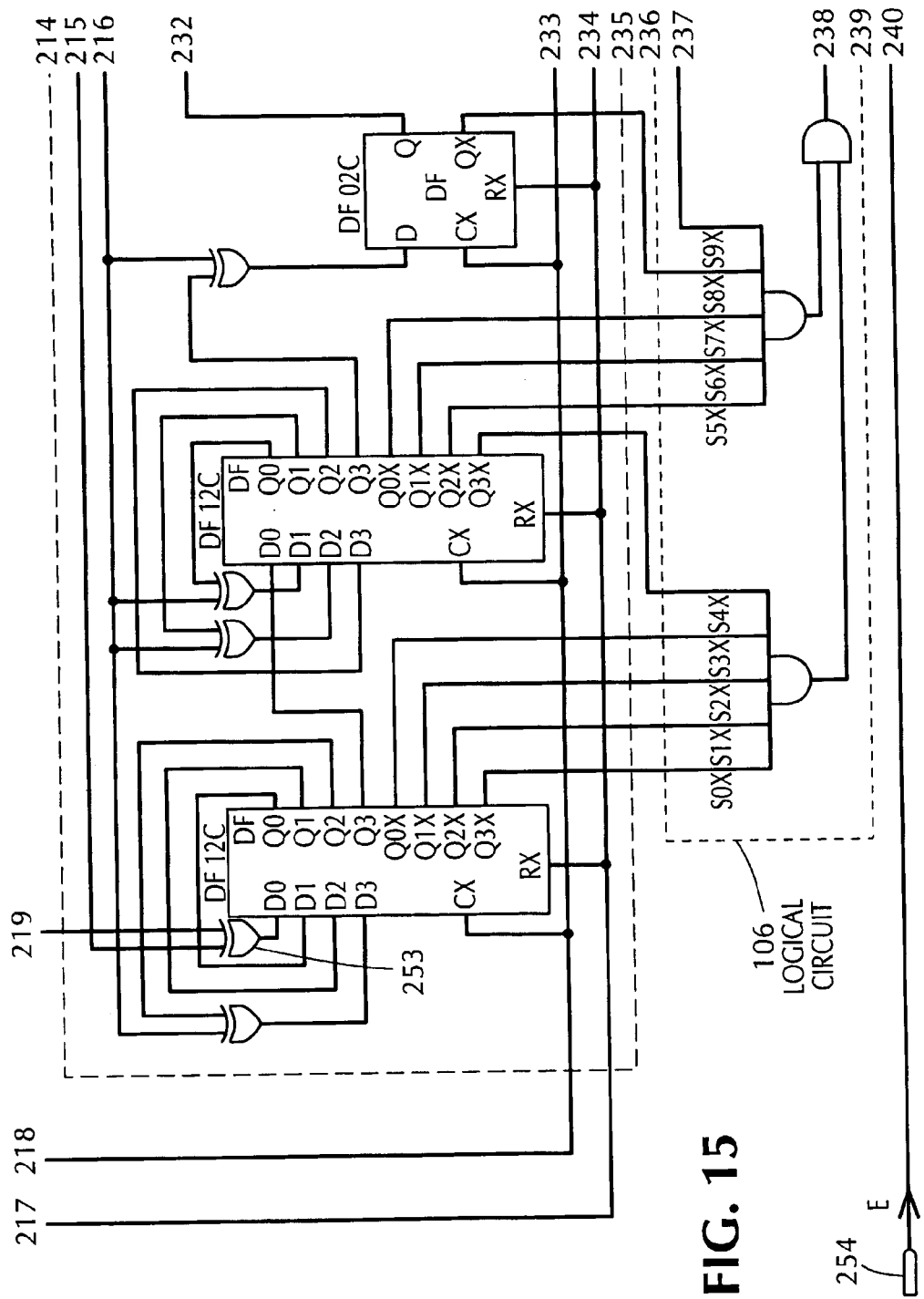
FIG. 15 is a circuit diagram showing one embodiment of the data processing unit of the present invention.
Figure 16:
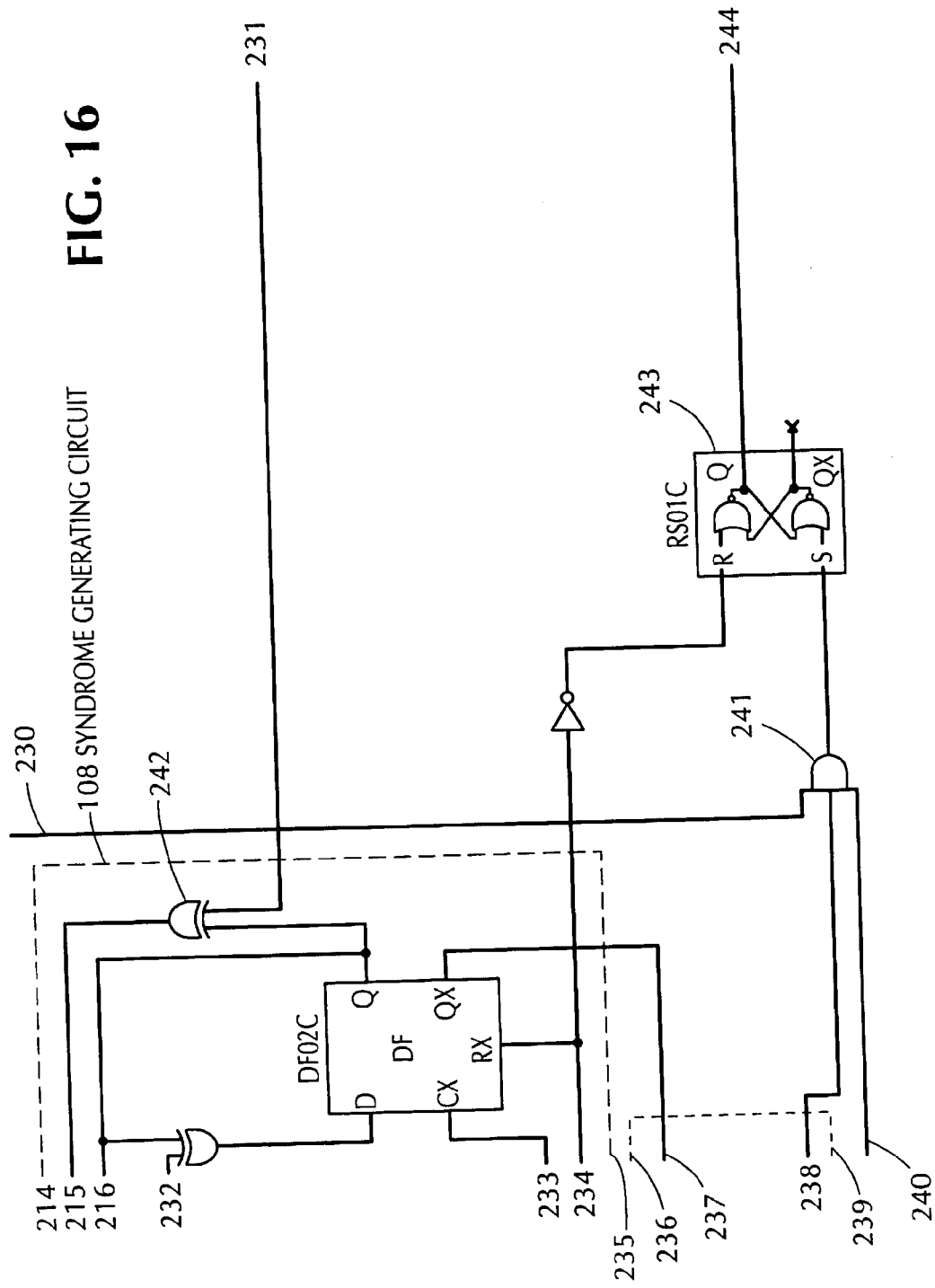
FIG. 16 is a circuit diagram showing one embodiment of the data processing unit of the present invention.
Figure 17:
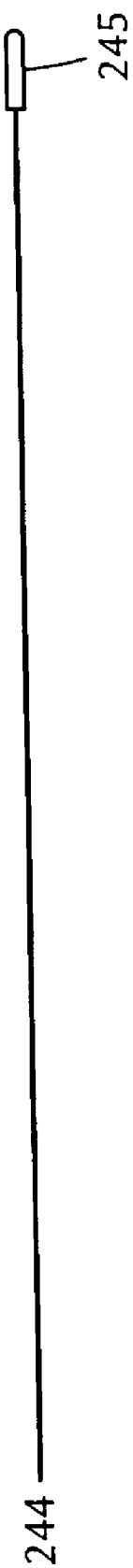
FIG. 17 is a circuit diagram showing one embodiment of the data processing unit of the present invention.

The operation of the data processing unit 101 constructed as described above will be explained below with reference to FIG. 9.

At first, when the reset signal RT turns to "L" level for a short period of time at time T1, the data register 102 and the syndrome generating circuit 103 are reset, thereby completing an initialization of the data processing unit 101. Then, when the level of the reset signal RT returns to "H", the clock pulses CL are started to be supplied. At this time, the level of the selection control signal SL is "L" and therefore, the received data RD is supplied to the data register 102 and the syndrome generating circuit 103 via the switching circuit 224 and is taken into the data register 102 per one bit in response to each trailing edge of the clock pulses CL. At the same time, the modulo-two arithmetic is executed within the syndrome generating circuit 103. When it comes to end to supply 31 clock pulses CL, the acquisition of one set of received data RD is completed and syndromes of the received data RD at that time are found and are input to the correction code decoder 109 as an output data RD.

When the acquisition of the received data RD and the arithmetic of the syndrome thus end, the level of the selection control signal SL is changed from "L" to "H" at time T2. Thereby, the switching circuit 224 selects the oldest data from the exclusive OR gate 228 and sends it to the data register 102. At this time, the syndrome generating circuit 103 performs the modulo-two arithmetic to an input as 0.

After time T2, the received data held within the data register 102 cycles per one bit every time when the clock pulse CL is input in the state described above and when an error bit within the received data is shifted to the innermost place in the data register 102, i.e. at the oldest bit position, either the output terminal CO1X or CO2X of the correction code decoder 104 turns to "L" level.

As a result, because the error bit within the received data is shifted to the innermost position in the data register 102, the level of one input of the exclusive OR gate 228 turns to "H". When a next clock pulse CK is added, the level of this error bit is reversed, i.e. the bit error is corrected, and it is shifted to the most front position in the data register 102. Thus two-bit errors within the received data are all corrected by supplying 31 clock pulses CL and when the clock pulses CL are all input, the received data whose errors have been corrected remains within the data register 102.

31 clock pulses CL are input again at time T3 to take out the data whose errors have been corrected from the data register 102. Thereby, the received data whose errors have been corrected is output per bit from the data register 102 and is taken out of the output terminal 227 as corrected received data SD.

Another embodiment of the present invention will be explained below in detail with reference to the drawings.

FIGS. 12 through 17 are circuit diagrams showing another embodiment of the data processing unit of the present invention. The data processing unit 101 discriminates errors in continuous N bit data in bit serial input data RD input from an input terminal 223 based on the CRC code. In the present embodiment, N=31 and the data processing unit 101 has a data register 102 for holding data and a syndrome generating circuit 108.

Both the data register 102 and the syndrome generating circuit 108 operate in response to clock pulses CL input from a clock input terminal 225. The data register 102 has the same structure with the data register used in the circuit shown in FIGS. 8 through 13. The data register 102 and the syndrome generating circuit 108 are reset by a reset signal RT supplied from a terminal 226.

The input data Rd input from an input terminal 223 is taken into the data register 102 sequentially in response to the clock pulses CL and at the same time, is sent also to the syndrome generating circuit 224 to calculate syndromes. A result of calculated syndromes is input to a logical circuit 106 as 10 bit parallel output data. The logical circuit 106 is a circuit similar to the logical circuit shown in FIGS. 8 through 13. It discriminates whether a value of the syndrome is 0 or not and "H" level is output when the value of the syndrome is 0.

An output of the logical circuit 106 is supplied to one remaining input of a three-input AND gate 241 to which enable signal E supplied from a terminal 225 and the clock pulse CL are input, and an output of the AND gate 241 is connected to a set terminal of a flip-flop 243. The reset signal RT whose level is reversed is applied to a reset terminal of the flip-flop 243 so as to be reset in response to predetermined changes of level of the reset signal RT. A Q output of the flip-flop 243 is connected to a check terminal 245.

Next, the syndrome generating circuit 108 will be explained below. The syndrome generating circuit 108 has an exclusive OR gate 253 to which the input data RD is input. Another input of the exclusive OR gate 253 is connected to an output of another exclusive OR gate 242. The syndrome generating circuit 108 is different from a syndrome generating circuit 108 shown in FIGS. 19 through 24 only in that the oldest data within the data register 102 is supplied to one input terminal of the exclusive OR gate 242 and the innermost data of the syndrome generating circuit 108 is supplied to the other input terminal. That is, the level of the input data input to the syndrome generating circuit 108 which acts as a checking circuit is reversed in accordance to the oldest data in the data register 102.

Figure 18:
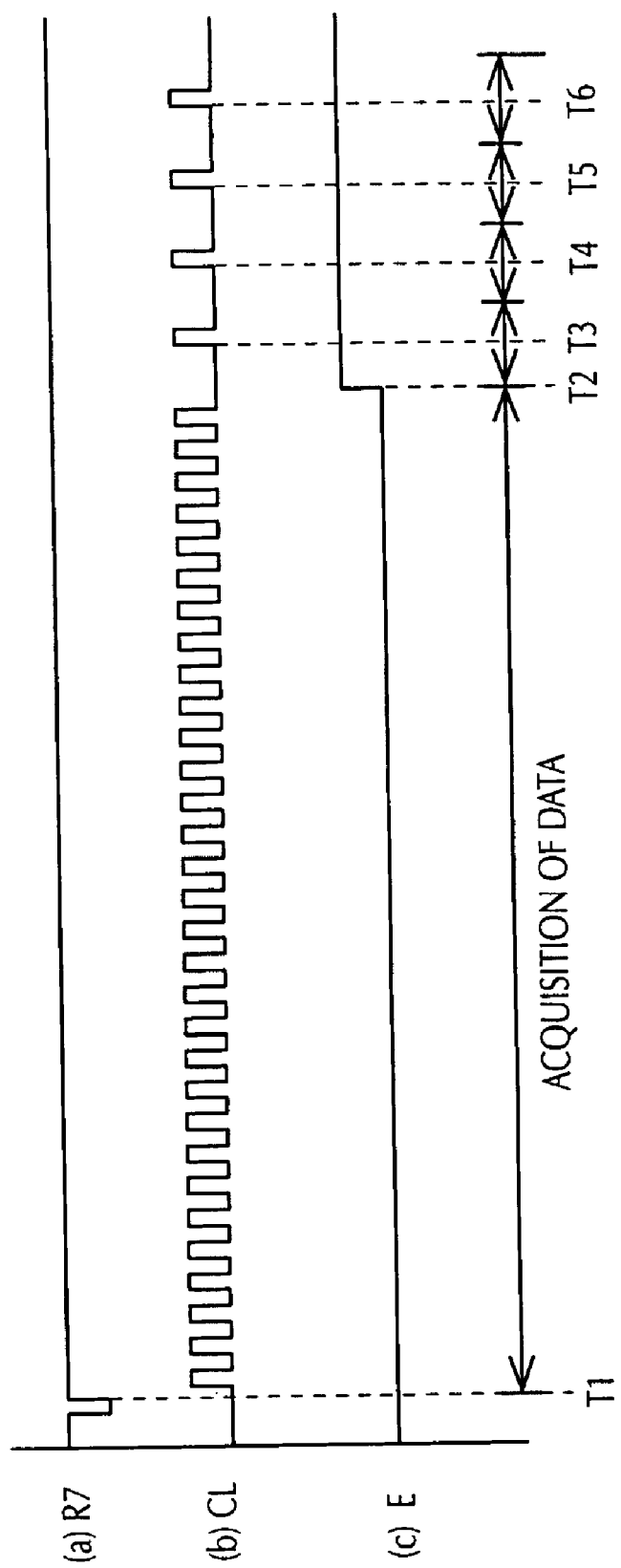
FIG. 18 is a signal waveform chart of each part for explaining operations of the data processing unit in FIGS. 12 through 17.
Figure 19:
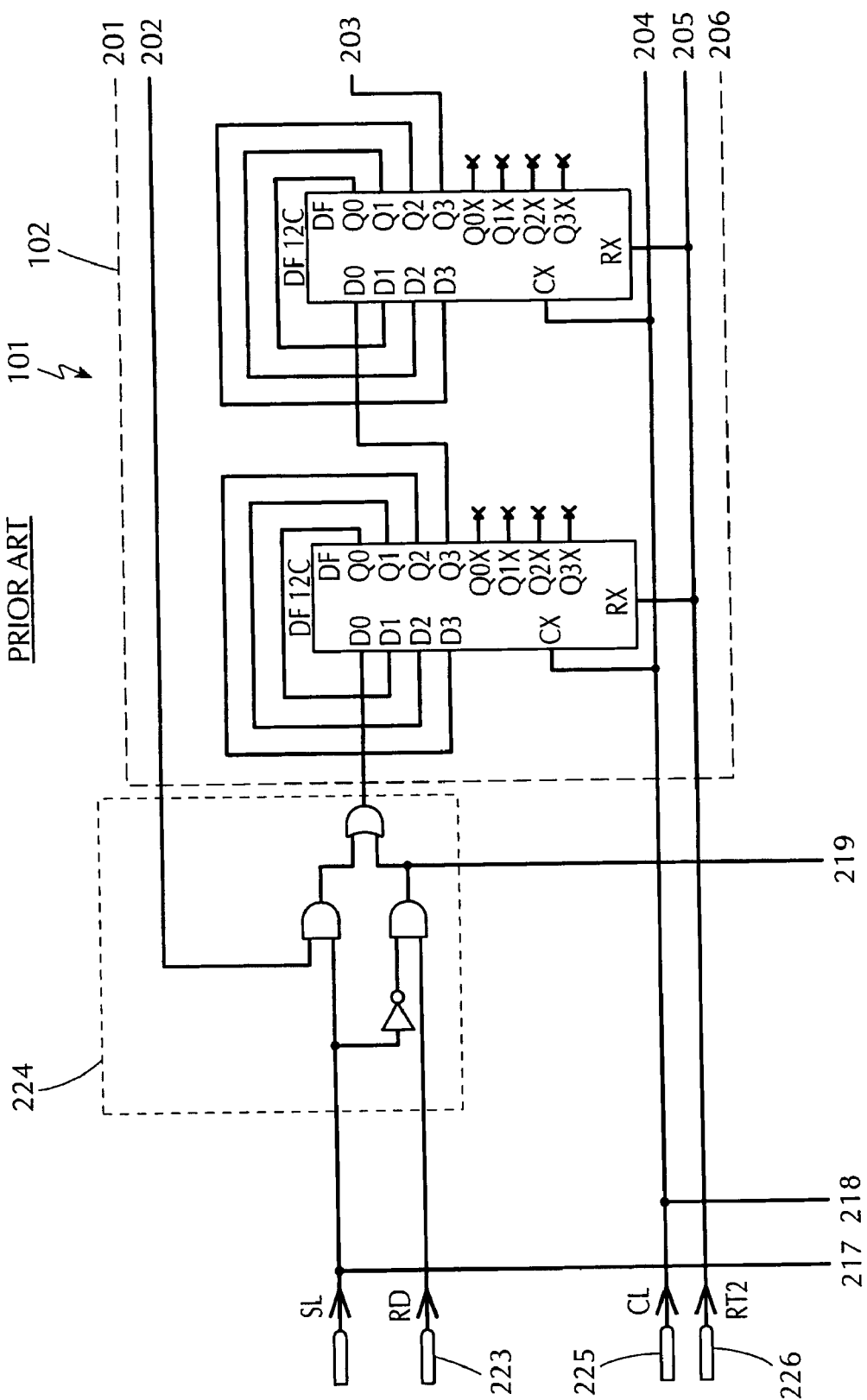
FIG. 19 is a circuit diagram showing one example of a prior art data processing circuit.
Figure 20:
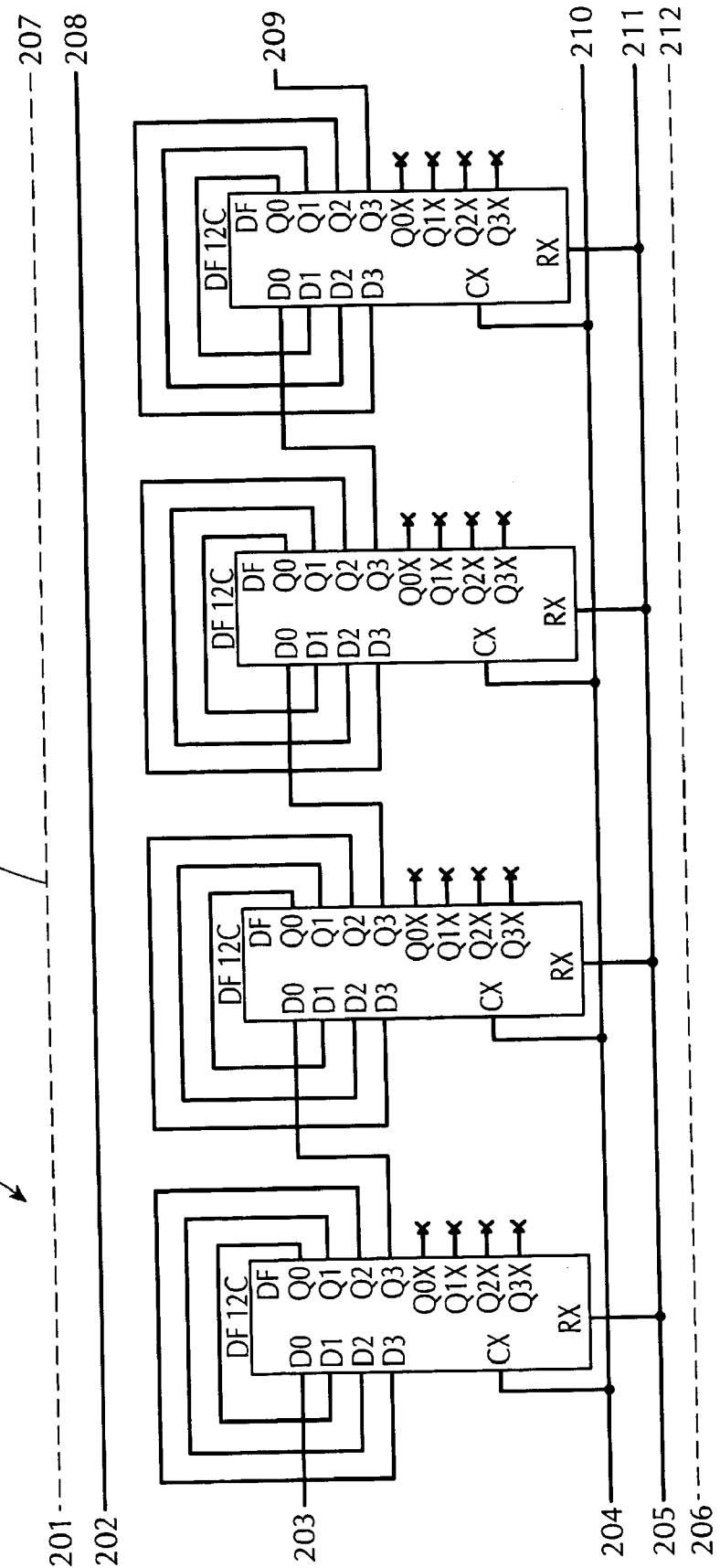
FIG. 20 is a circuit diagram showing one example of the prior art data processing circuit.
Figure 21:
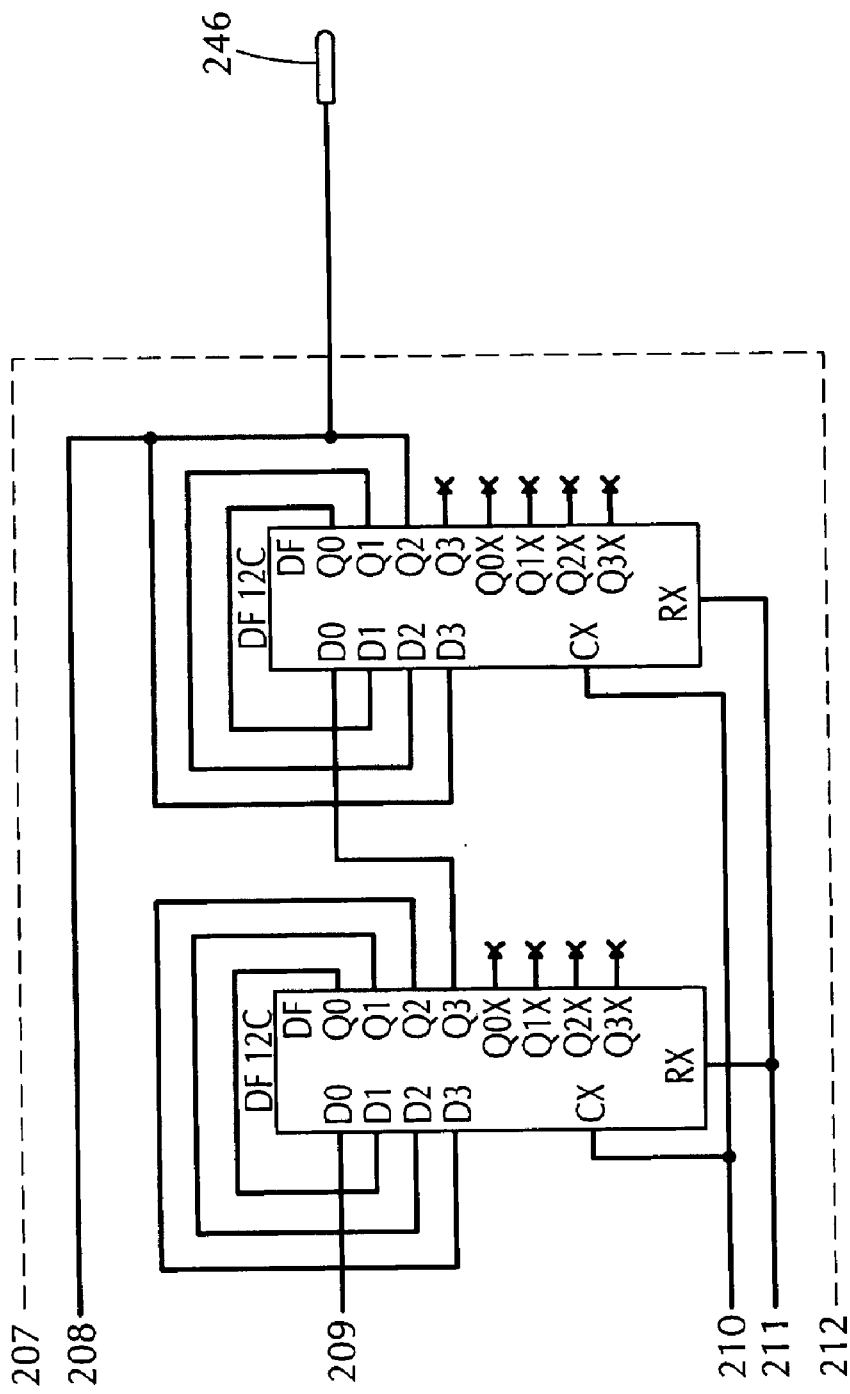
FIG. 21 is a circuit diagram showing one example of the prior art data processing circuit.
Figure 22:
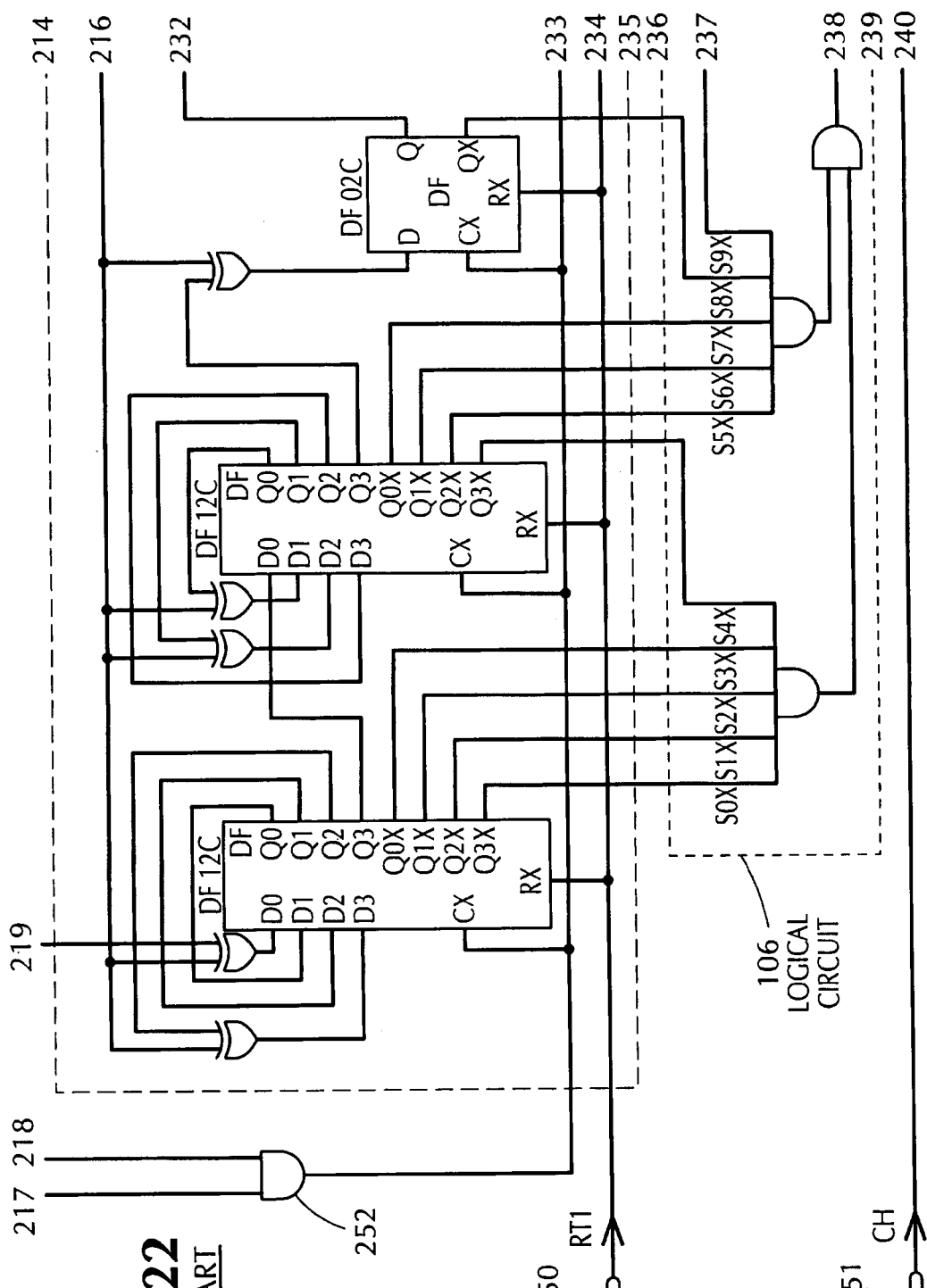
FIG. 22 is a circuit diagram showing one example of the prior art data processing circuit.
Figure 23:
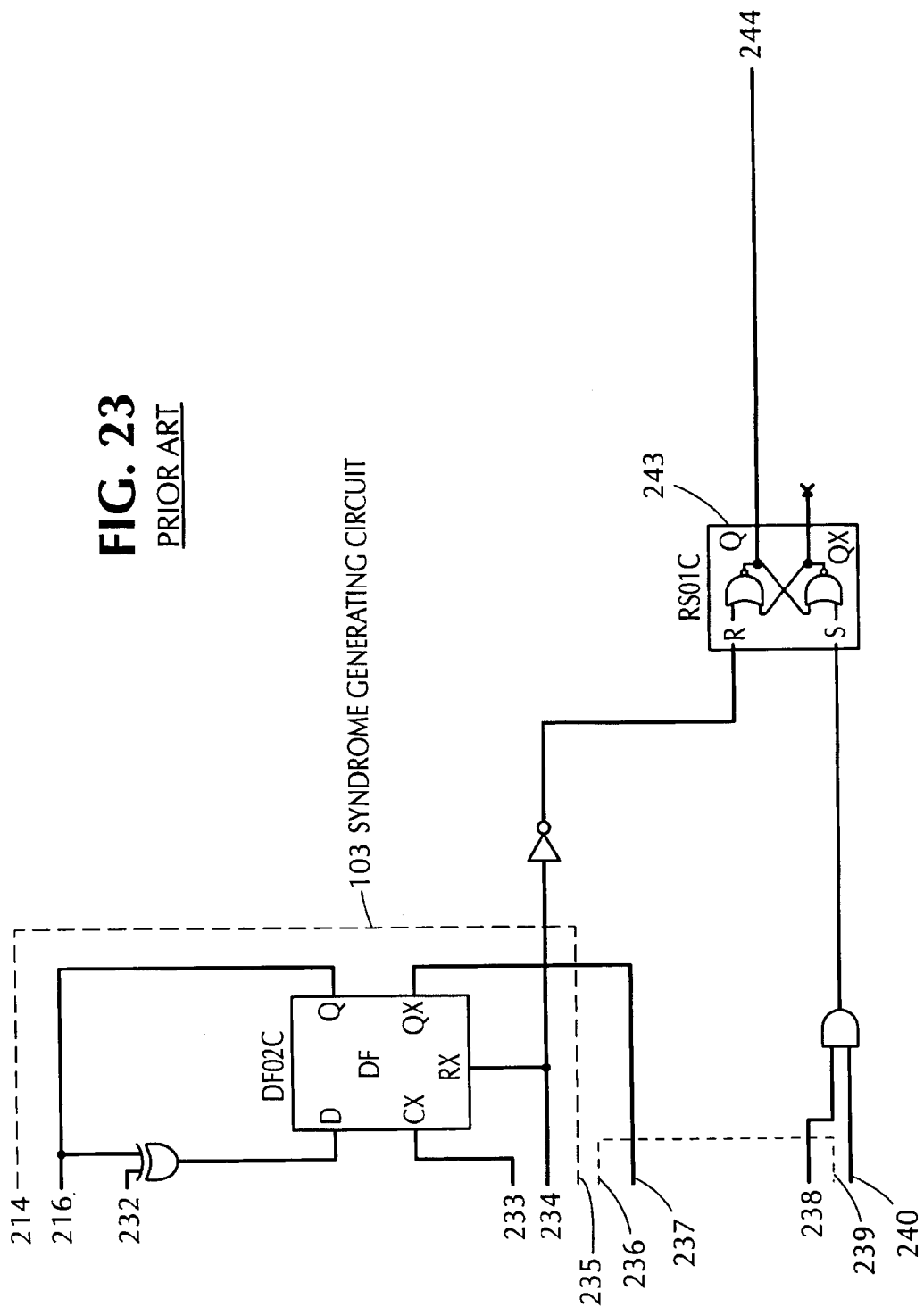
FIG. 23 is a circuit diagram showing one example of the prior art data processing circuit.
Figure 24:
FIG. 24 is a circuit diagram showing one example of the prior art data processing circuit.
Figure 25:
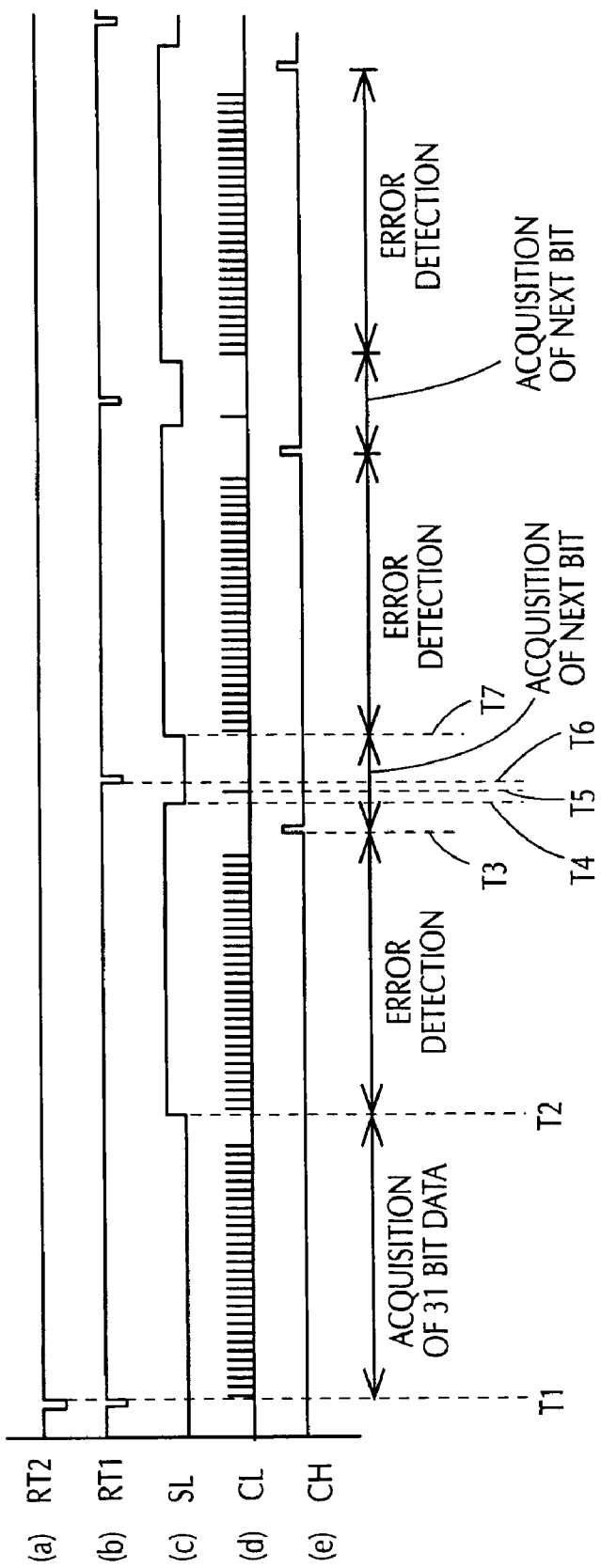
FIG. 25 is a signal waveform chart of each part for explaining operations of the prior art circuit shown in FIGS. 19 through 24.

Next, the operation of the data processing unit 101 will be explained with reference to FIG. 18.

After when the reset signal RT turns to "L" level for a short period of time at time T1 and the initialization is completed, 31 clock pulses CL are output. Thereby, continuous 31 bit data of the input data RD supplied from the input terminal 223 is acquired and held in the data register 102. At the same time with the acquisition of the data, the input data RD is sent also to the syndrome generating circuit 108. Because the oldest data in the data register 102 is at "L" level due to the reset operation at this time, the input data RD is input without being reversed. Then, the syndrome is calculated.

When the 31 bit input data RD is acquired, the enable signal E turns to "H" level at time T2, creating a state wherein errors can be checked.

Then, the clock pulse CL is output at time T3. Thereby, at the same time, next data is taken into the data register 102, the error is checked by supplying the output from the logical circuit 106 to the set input terminal of the flip-flop 243 by opening the AND gate 241 and the next data is sent to the syndrome generating circuit 108 to calculate the syndrome of continuous 31 bit data including the next data.

This will be explained in detail below. The clock pulse CL output at time T3 is input to the AND gate 241 and thereby, an output value of the logical circuit 106 at that time is supplied to the set input terminal of the flip-flop 243. Accordingly, the flip-flop 243 is not set and the level of the check terminal 245 remains at "L" level, indicating that there is an error, if the syndrome of the 31 bit input data set in the data register 102 at first is 1.

The clock pulse CL output at time T3 is also input to the data register 102, and thereby the next bit data is taken in anew, shifting out the oldest data by one bit. Thereby, the latest 31 bit input data is held in the data register 102.

The next bit data is also taken into the syndrome generating circuit 108 in response to the application of the clock pulse CL. In this case, an exclusive OR of the innermost data of the syndrome generating circuit 108 and the oldest data shifted out in the data register 102 is created in the exclusive OR gate 242 and is supplied to the exclusive OR gate 253, so that the influence of the data is canceled and the syndrome for the latest 31 bit input data is generated in the syndrome generating circuit 108.

That is, while clock pulses had to be applied 31 times in the prior art apparatus when the next bit data is taken in to find its syndrome value, the data processing unit 41 of the present invention shown in FIGS. 12 through 17 requires no such operation and the syndrome for the latest 31 bit input data may be found by supplying only one clock pulse CL. As a result, because it allows to reduce a number of times of changes of signal in the circuit remarkably, the power consumption of the circuit may be considerably reduced.

Thus, the error check is executed by taking in next bit data sequentially by supplying clock pulses CL sequentially at times T4, T5, T6 . . . and by finding a value of syndrome for the latest 31 bit input data at each time. When there is no error, the syndrome becomes 0 and the level of the output terminal 245 turns to "H" level. Then, the set of data held in the data register 102 at that time is correct data and it is possible to clarify the word boundary.

Figure 26:
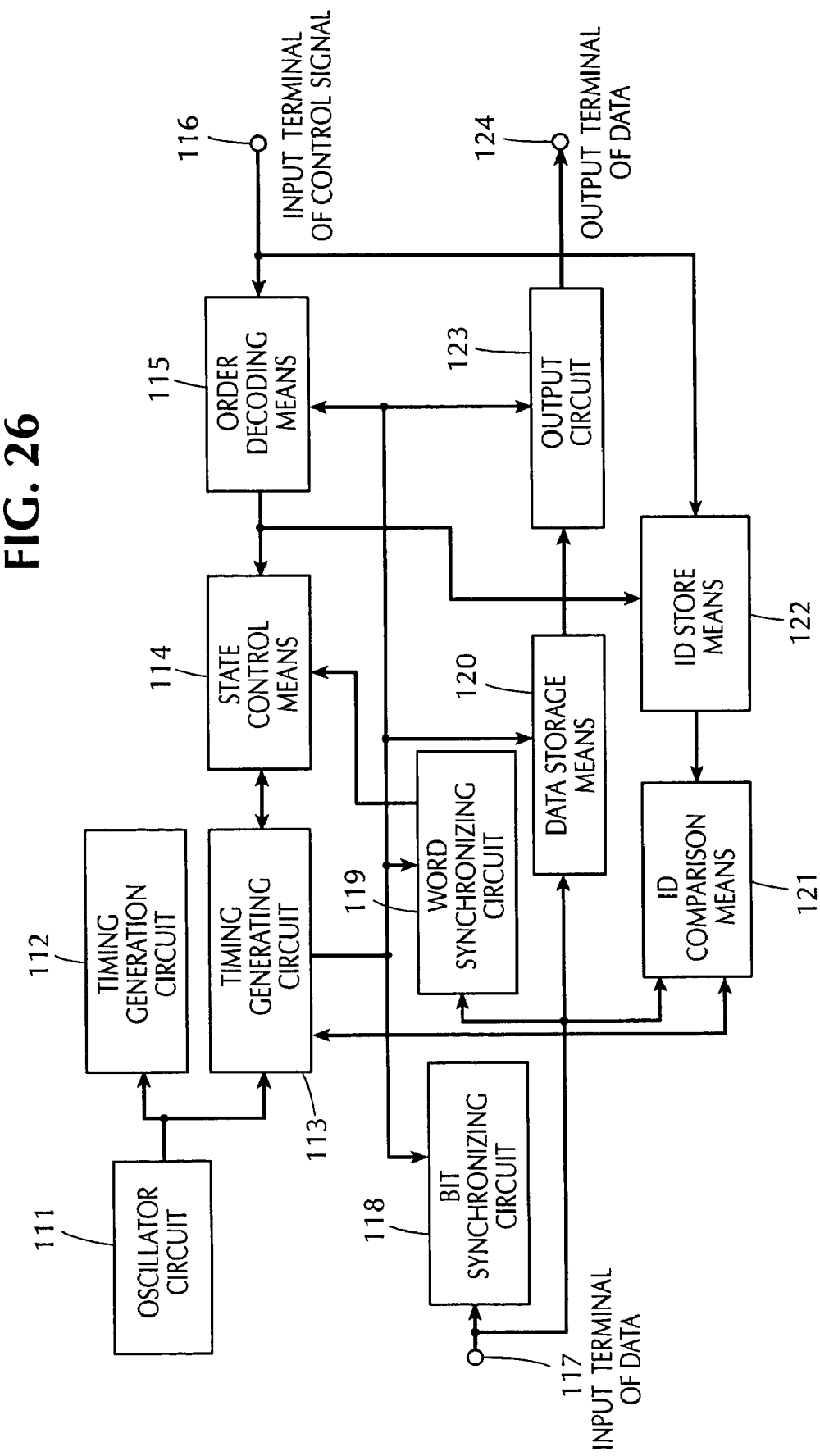
FIG. 26 is a block diagram showing one embodiment of a serial synchronous receiver of the present invention.
Figure 27:
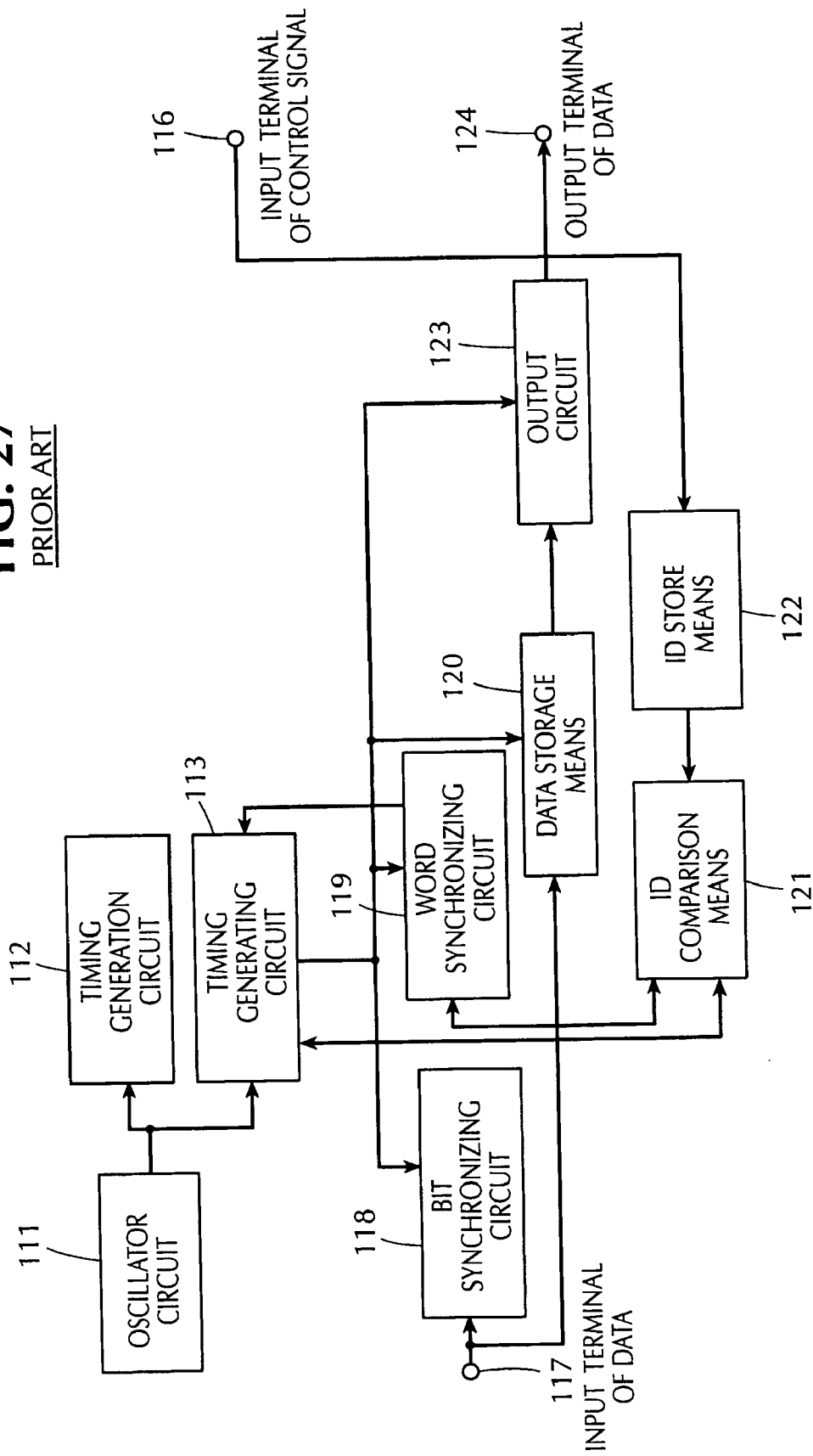
FIG. 27 is a block diagram showing a prior art serial data receiving apparatus.

A serial data receiving apparatus of the present invention will be explained below in detail with reference to the drawings. FIG. 26 shows one embodiment of the serial data receiving apparatus of the present invention having state control means in the form of a block diagram.

In FIG. 26, an output of an oscillation circuit 111 is input to a timer counter 112 and a timing generating circuit 113. Timing signals output from the timing generating circuit 113 are input beginning from state control means 114 to a bit synchronizing circuit 118, a word synchronizing circuit 119, data storage means 120 and to an output circuit 123.

A command is input from a control input terminal 116 to a command decoder 115. An output of the command decoder 115 is input the state control means 114 and ID storage means 122. The state control means 114 shifts mode by being operated by the command. Further, it is possible to rewrite contents of the ID storage means 122 by the command.

A PAUSE command is input at first from the control input terminal 116 when the content of the ID storage means 122 is rewritten using a PAUSE mode. The command decoder 115 sets the state control means 114 at the PAUSE mode. In this state, while the operation of ID collating means 121 is stopped and no data is read from the ID storage means 122, other parts operate normally. Accordingly, the synchronism for the input signal is held as it is. When a command for rewriting the ID storage means 122 is input in succession, the command decoder 115 puts the ID storage means 122 into a writable state. The contents of the ID storage means 122 is rewritten when an ID code is input from the control input terminal 116 in this state.

Figure 28:
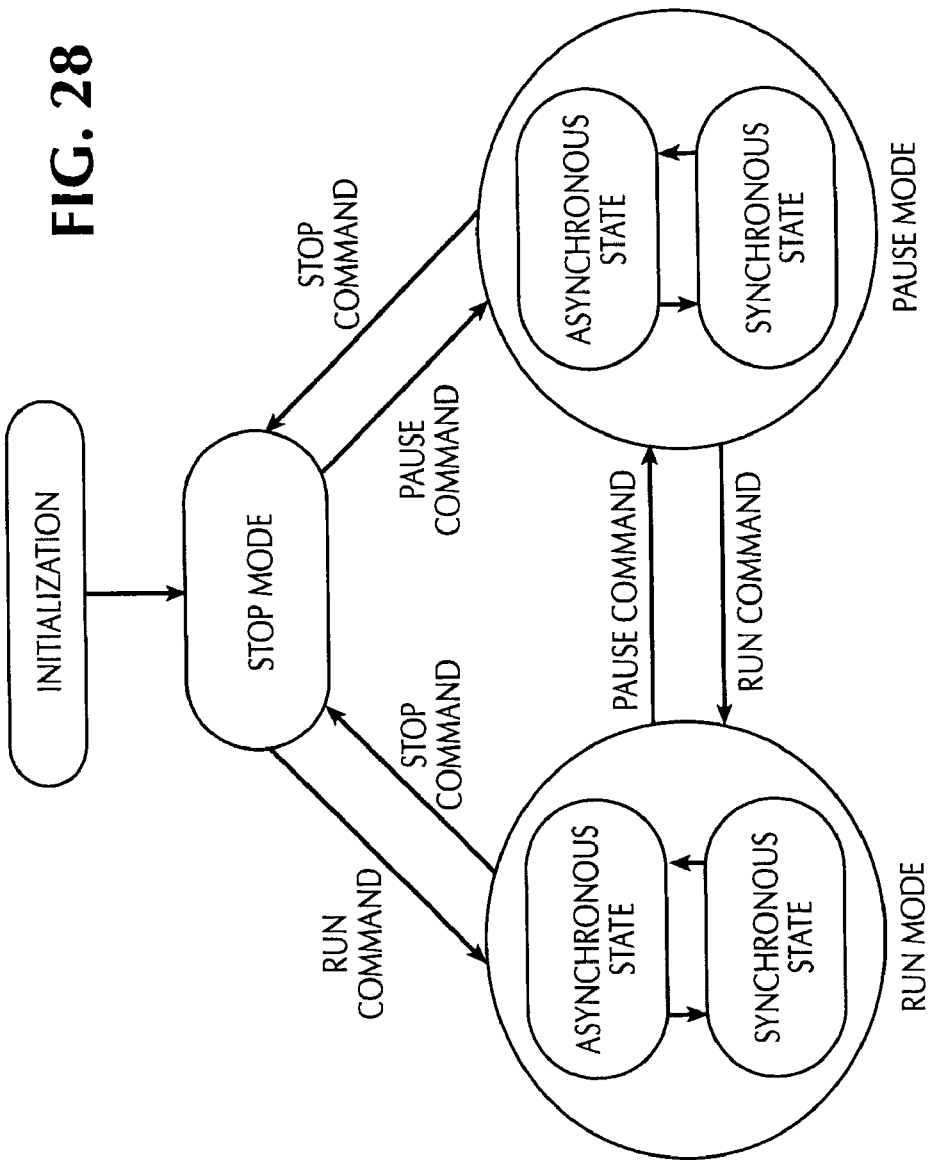
FIG. 28 is a state transition diagram of the serial data receiving apparatus of the present invention.
Figure 29:
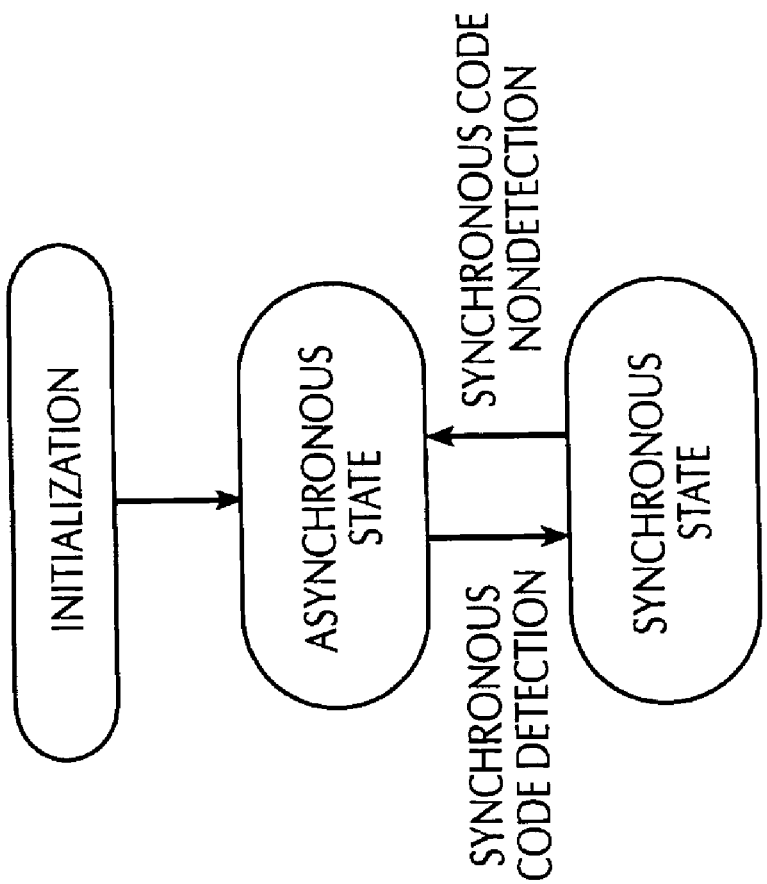
FIG. 29 is a state transition diagram of the prior art serial data receiving apparatus.

FIG. 28 shows one embodiment representing each mode and transition thereof controlled by the state control means 114. After the initialization, the state control means 114 automatically shifts to a STOP mode. When it receives a RUN command in this state, it shifts to an asynchronous state in the RUN mode. When a synchronous code is detected at this time, it shifts to a synchronous state in the RUN mode. In rewriting the contents of the ID storage means 122 in FIG. 26, normally the PAUSE command is run in this state. The state control means 114 shifts to the PAUSE mode by the PAUSE command. The contents of the ID storage means 122 may be rewritten while maintaining this state unless it fails to detect the synchronous code. When the RUN command is run again after finishing the rewriting, the state control means 114 shifts to the RUN mode and starts to receive data. Because the time required for that is sufficiently short, it is possible to be ready for the next transmission continuously without missing to receive data.

Because the components between a data input terminal 117 and a data output terminal 124 operate in the same manner with the prior art, they are designated with the same reference numerals and the explanation thereof will be omitted here.

Figure 30:
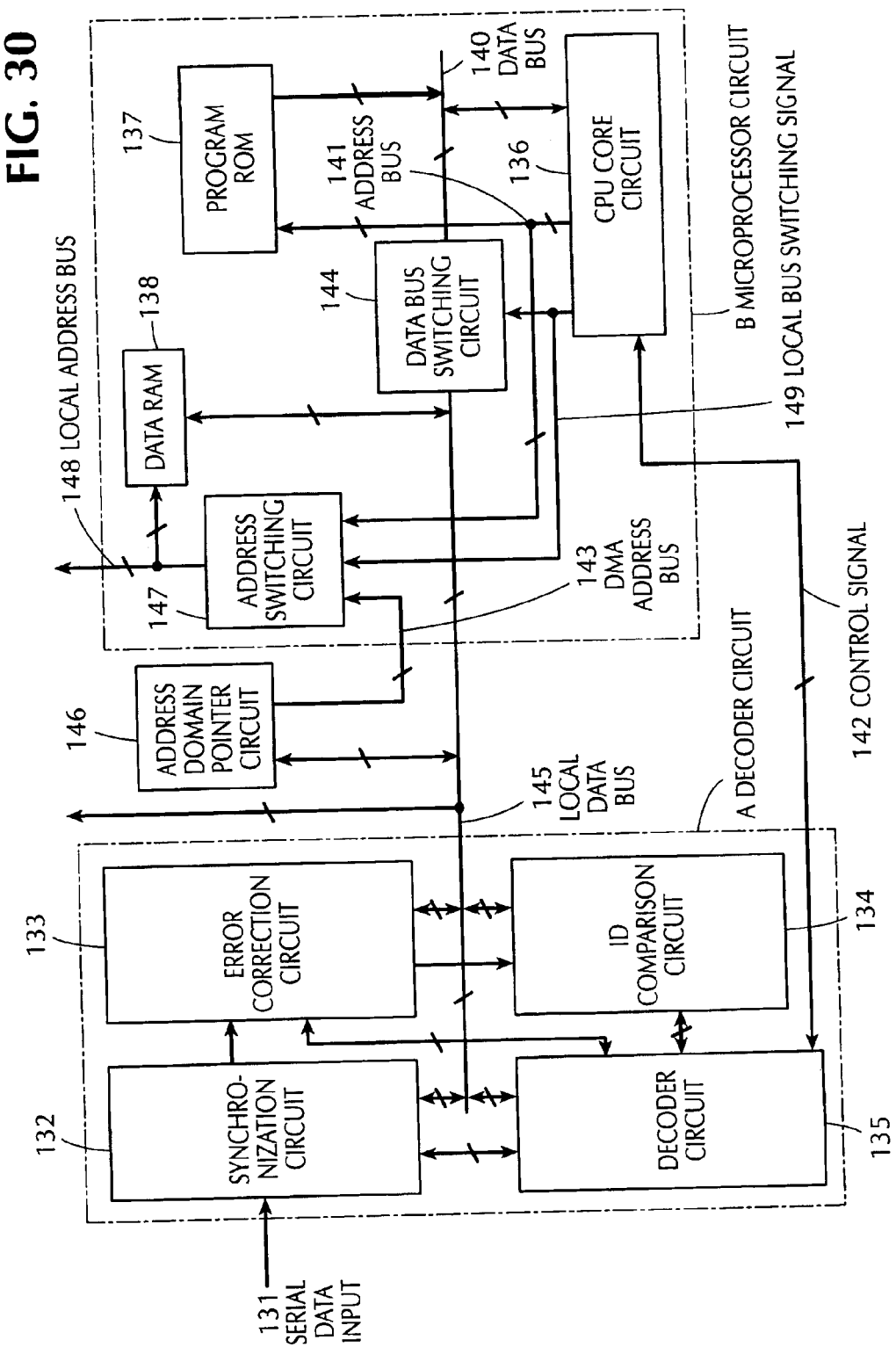
FIG. 30 is a block diagram showing one embodiment of the serial data receiving apparatus of the present invention.
Figure 31:
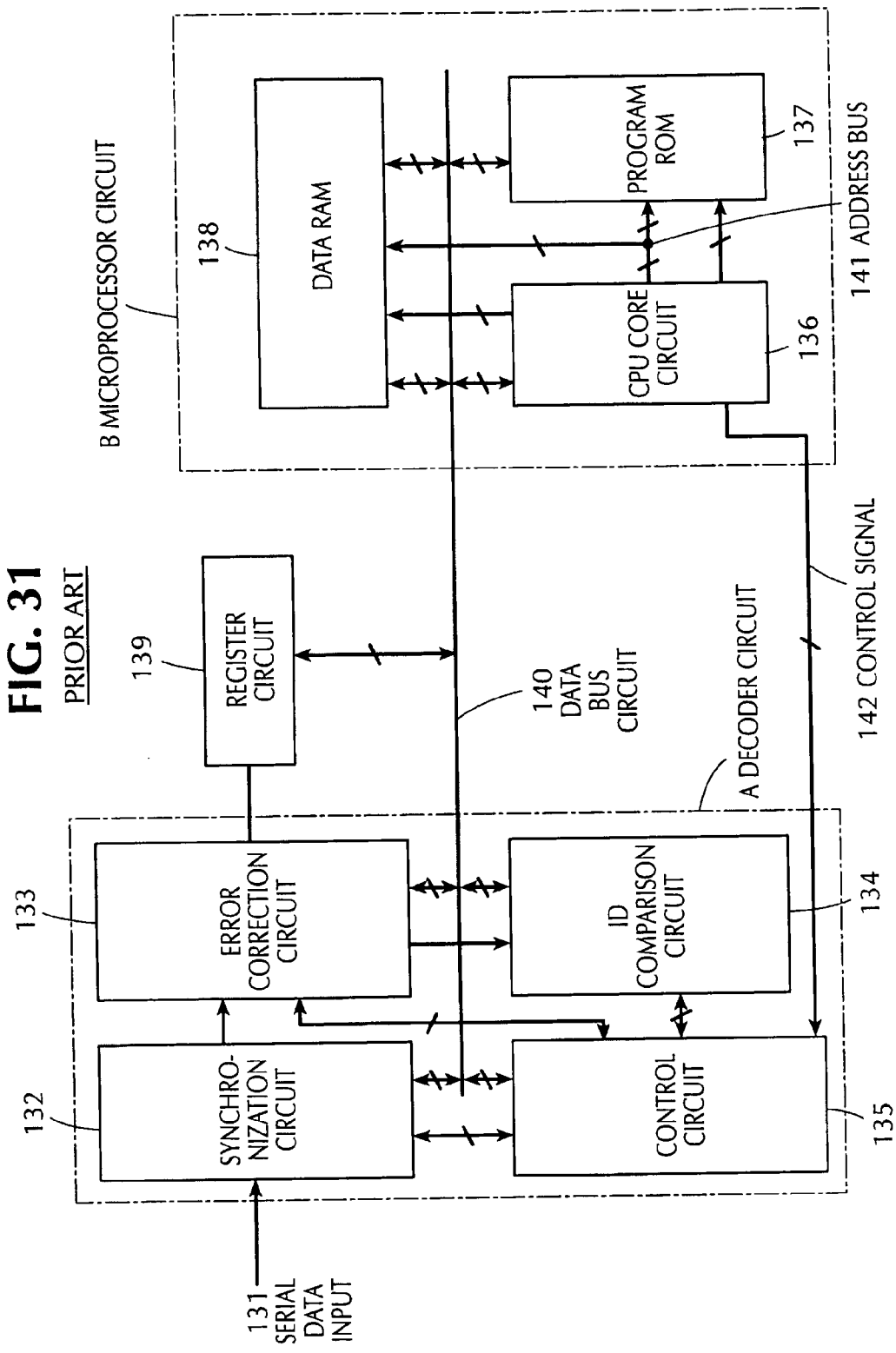
FIG. 31 is a block diagram showing the prior art serial data receiving apparatus.

Another serial data receiving apparatus of the present invention will be explained below in detail with reference to the drawings. FIG. 30 shows one embodiment of the serial data receiving apparatus of the present invention having an address switching circuit for directly accessing to a data RAM from a decoder and a circuit for specifying an area to be accessed, in the form of a block diagram. Note that a line having a short slant line in the figure indicates that it comprises a plurality of lines.

In FIG. 30, when a serial data input 131 is input to a synchronizing circuit 132 within a decoder circuit A, the input signal is synchronized to take in the data. The acquired data is determined whether it is data to be received by an ID collating circuit 134 after detecting and correcting its communication error by an error correction circuit 133. When it is determined to be data to be received from a coincidence of IDs, the data is acquired in succession.

The acquired data is stored sequentially in a data RAM 138 via a data bus 145. When predetermined data is input to the decoder circuit A, a control circuit 135 carries the received data on the data bus 145 with a predetermined timing by receiving timing signals from a CPU core circuit 136. Write address in the data RAM 138 is specified by an address domain pointer circuit 146 and an address switching circuit 147. When the CPU normally operates, while the address in the data RAM 138 is specified through an address bus 141, a DMA address bus 143 is selected by the address switching circuit 147 and becomes an address bus of the data RAM 138 when the decoder circuit A accesses to the data RAM 138.

Figure 32:
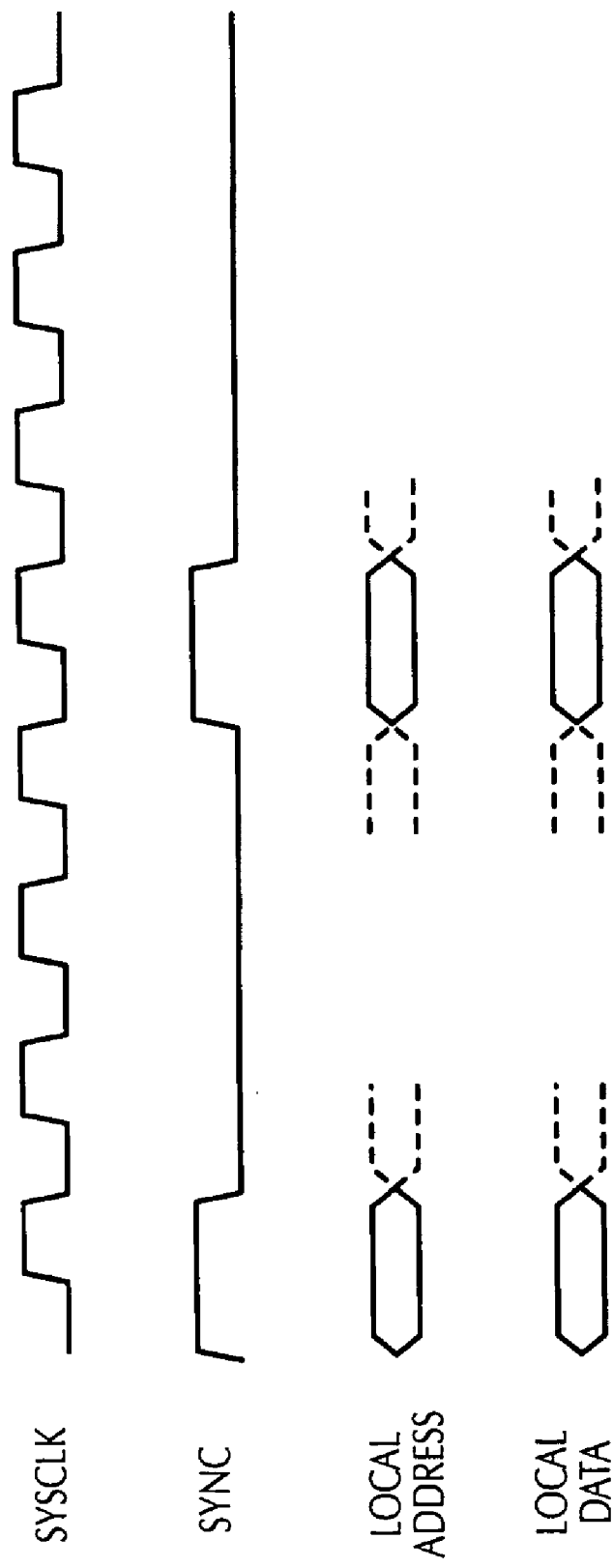
FIG. 32 is a operation timing diagram of the serial data receiving apparatus of the present invention.

FIG. 32 shows one embodiment of timings of the address bus 141 and the DMA address bus 143 switched by the address switching circuit 147 together with a system timing of the CPU core circuit 136. When the CPU core circuit 136 is not in an operative state, any timing can be taken and it is not necessary to synchronize with the system timing. The operation timing shown in FIG. 32 permits to write the received data to the data RAM 138 without any problem even when the CPU core circuit 136 is in the midst of operation. In FIG. 32, SYSCLK represents the system clock. SYNC represents a timing for fetching a command, a timing when a program ROM 137 is invariably accessed. A period from a pulse of SYNC to a next pulse of SYNC represents a machine cycle and is equivalent to an execution time of one command. The SYNC timing is utilized in writing received data directly from the decoder circuit A to the data RAM 138. Because the data RAM 138 is not accessed by the CPU core circuit 136 with this timing, a local address bus 148 may be switched to the DMA address bus 143 and the data received by the decoder circuit A may be carried on the data bus 140 to write to the data RAM 138.

When writing of necessary data is completed or when data is written to all the areas in the data RAM specified by the address domain pointer circuit, an interrupt is generated to the microprocessor circuit B and processing of the written data (recording, display, etc.) is carried out by the action of the CPU core circuit 136.

To extend a capacity of the data RAM, the local address bus 148 is output outside. The memory area can be extended by the local address bus 148, the data bus 140 and some control signals. It is also possible to specify the extended memory space by the address domain pointer circuit 146. It allows to receive a large amount of data without operating the CPU core in receiving it continuously.

An explanation of the operation of the address domain pointer circuit 146 is omitted here since it is apparent.

Figure 33:
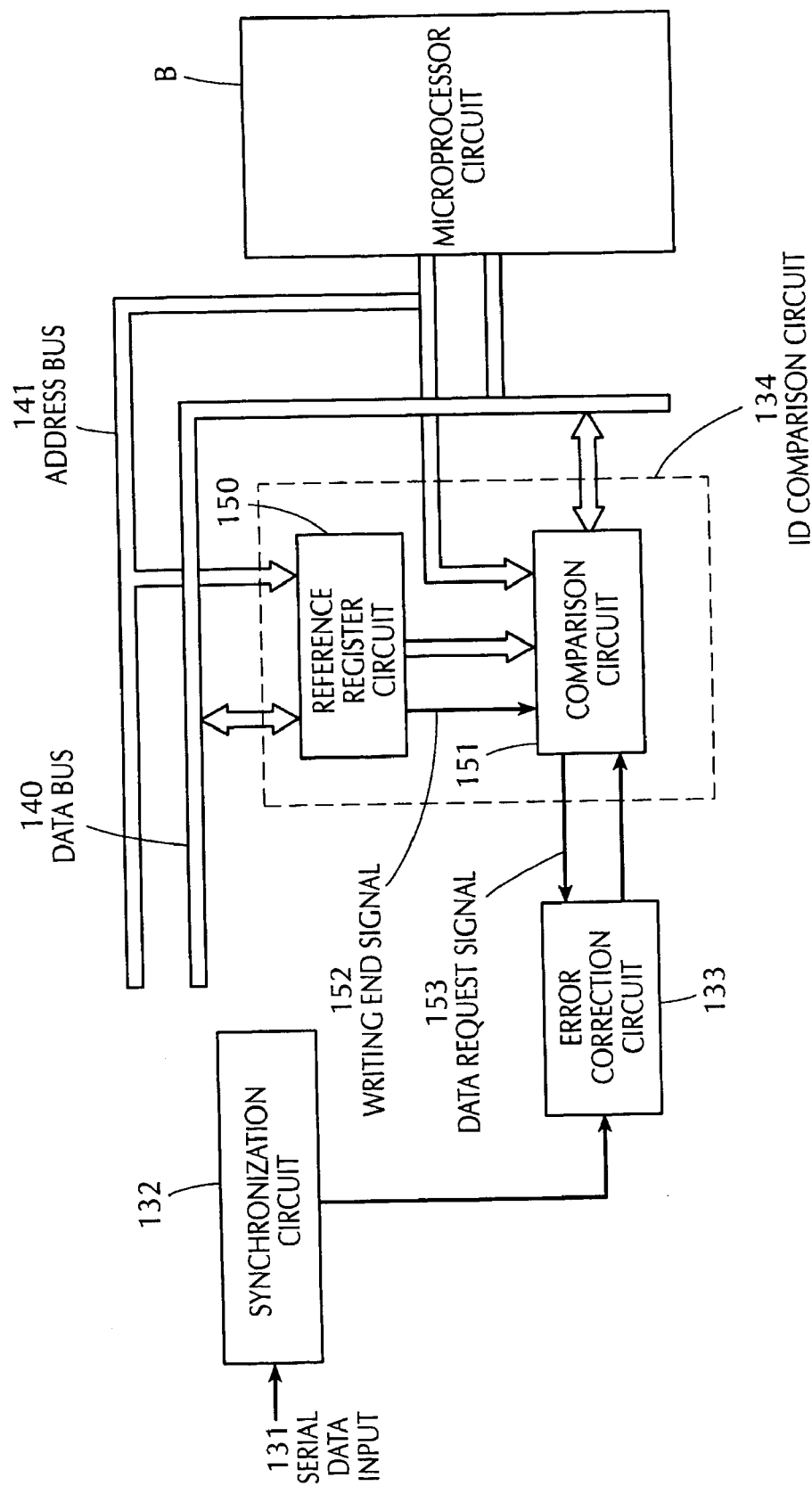
FIG. 33 is a block diagram showing one embodiment of the serial data receiving apparatus of the present invention.
Figure 34:
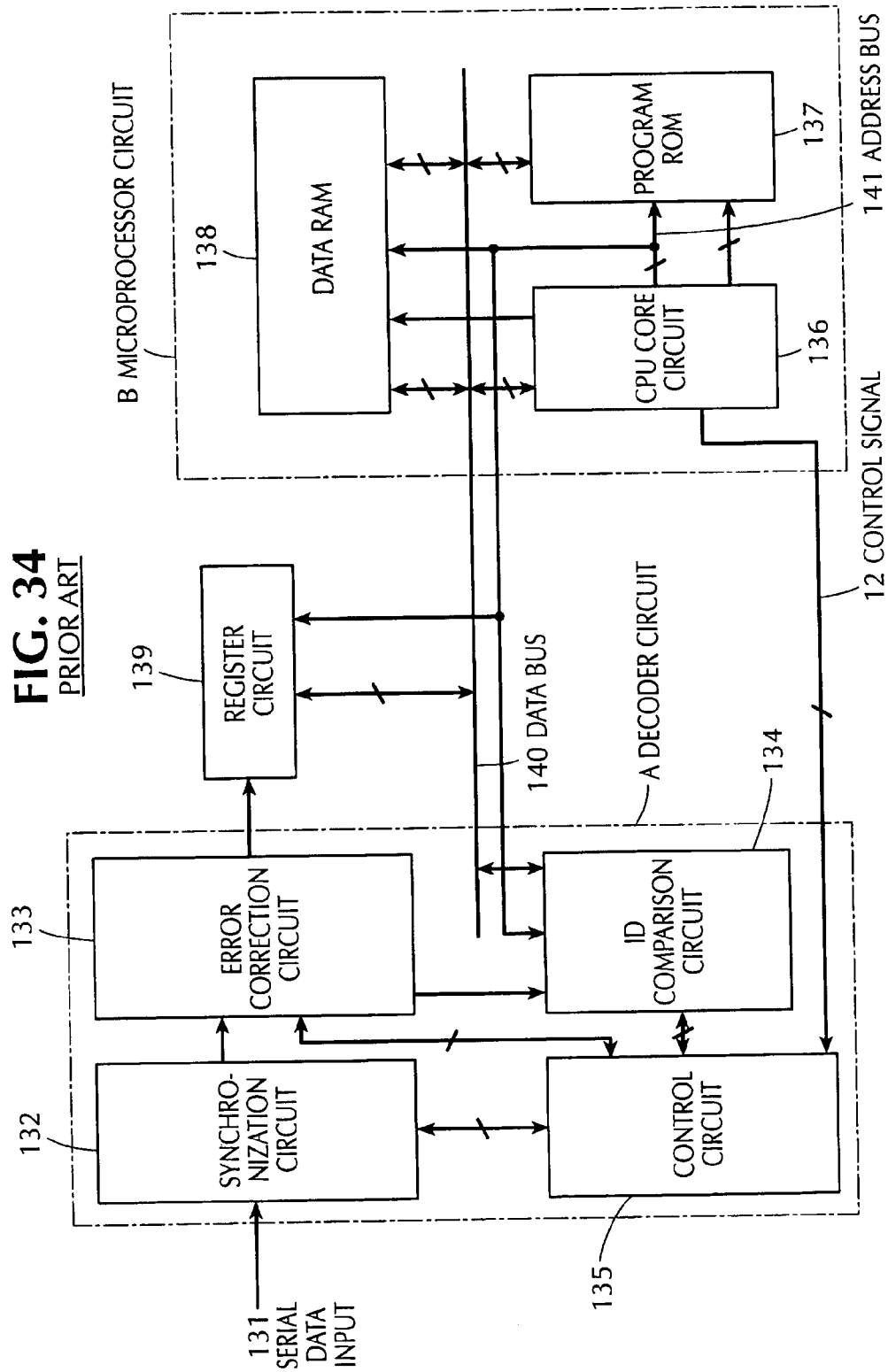
FIG. 34 is a block diagram showing a prior art serial data receiving apparatus.
Figure 35:
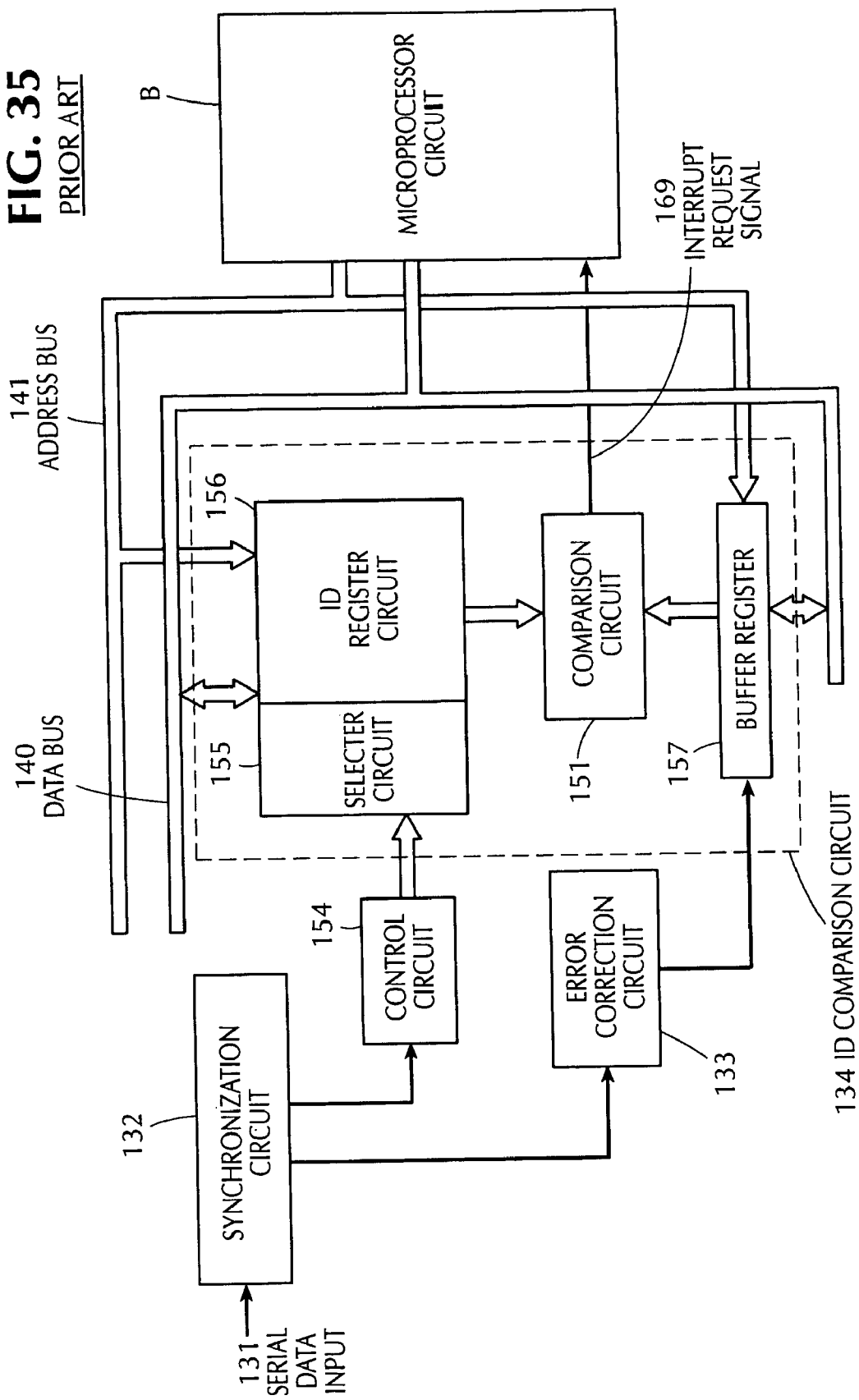
FIG. 35 is a block diagram showing a prior art serial data receiving apparatus.

A still other serial data receiving apparatus of the present invention will be explained below in detail with reference to the drawings. FIG. 33 shows one embodiment of the serial data receiving apparatus of the present invention comprising an ID collating circuit connected with a microprocessor circuit and having a register circuit and a comparison circuit, a synchronizing circuit for synchronizing serial data and an error correction circuit, in the form of a block diagram.

In FIG. 33, when a serial data input 131 is input to a synchronizing circuit 132, the input signal is synchronized to take in the data. The acquired data is determined whether it is data to be received by the ID collating circuit 134 after detecting and correcting its communication error by the error correction circuit 133. When it is determined to be data to be received from a coincidence of IDs, the data is acquired in succession.

The ID collating circuit 134 comprises the reference register circuit 150 connected to a data bus 140 and the comparison circuit 151 for comparing an output of the error correction circuit with data in the reference register circuit 150. Data, converted from serial to parallel, of a plurality of IDs is written to the reference register 150 from the built-in RAM of a microprocessor circuit B sequentially from a head bit. If an 8-bit CPU is used for example, it is possible to compare up to eight IDs at the same time. If IDs more than that are assigned, data is transferred to the reference register circuit 150 by dividing it into more than twice every time when one bit is received. When the data is written to the reference register circuit 150, an end-of-writing signal 152 is issued and the data is compared with the received data by the comparison circuit 151. When the comparison is finished, the comparison circuit 151 outputs a data request signal 153 to the error correction circuit 133. Receiving the data request signal 153, the error correction circuit 133 transfers one bit of next received data to the comparison circuit 151. Then, the next bit of the ID is compared.

The comparison result is taken into the microprocessor circuit B via the data bus 140. The microprocessor circuit B accumulates results of inconsistency and when a certain number of or more bits do not coincide, it assumes that the ID does not coincide in accordance to a program. If all the IDs do not coincide, the receiving is terminated.

The data (message) is received in succession if a coincident ID is found even only one.

Figure 36:
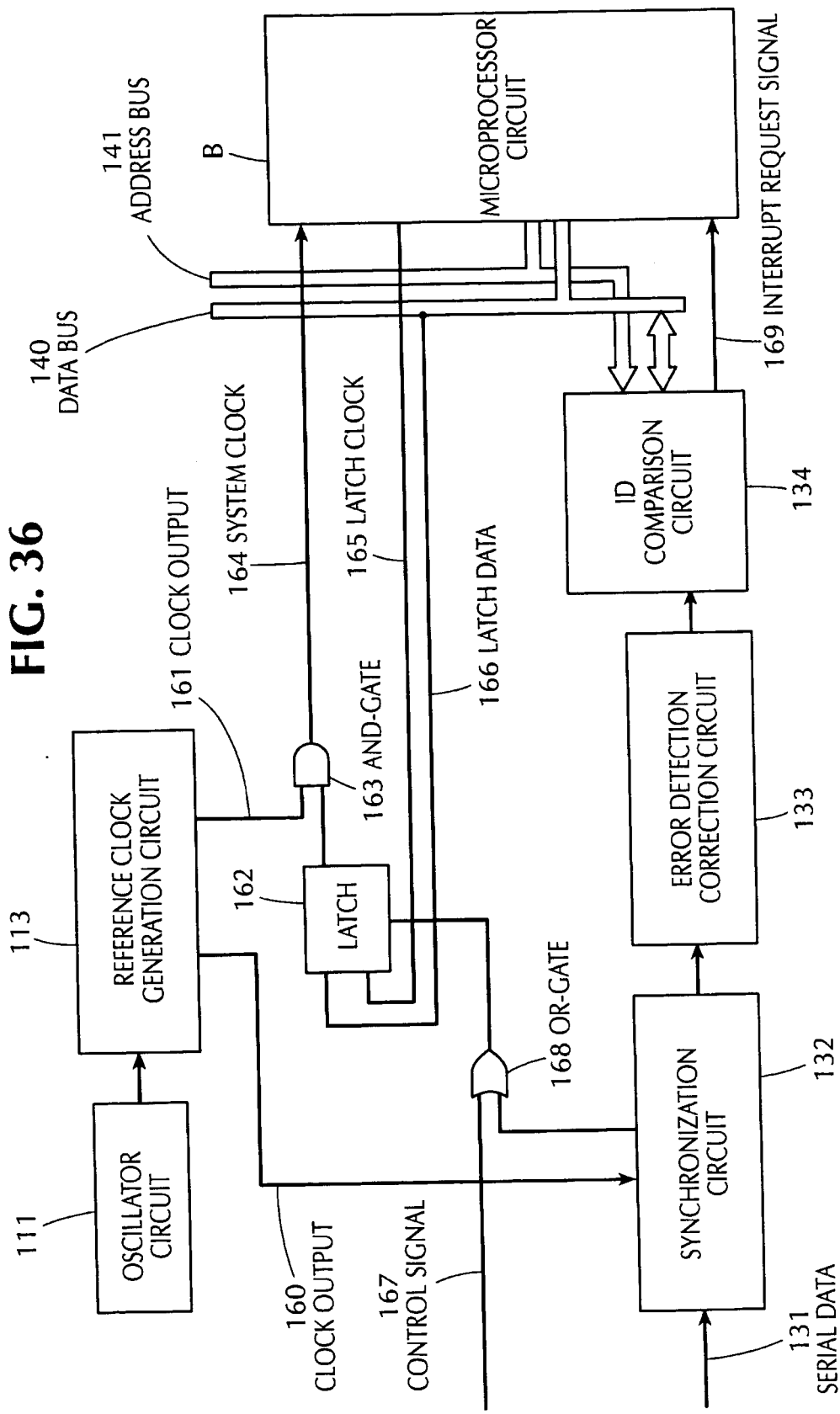
FIG. 36 is a block diagram showing one embodiment of the serial data receiving apparatus of the present invention.
Figure 37:
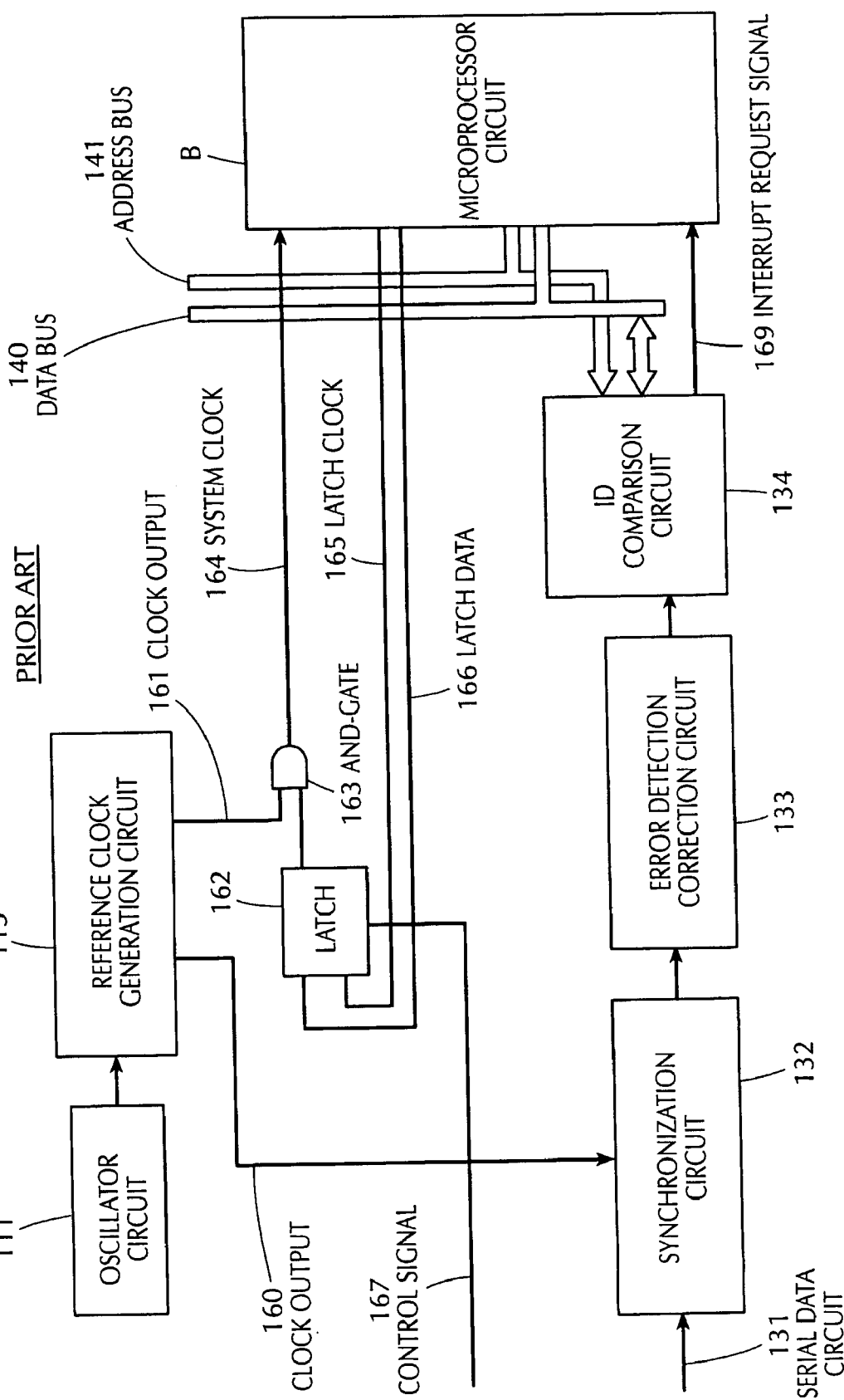
FIG. 37 is a block diagram showing a prior art serial data receiving apparatus.

A still other serial data receiving apparatus of the present invention will be explained below in detail with reference to the drawings. FIG. 36 shows one embodiment of the serial data receiving apparatus of the present invention comprising an ID collating circuit connected with a microprocessor circuit, a synchronizing circuit for synchronizing serial data, an error detection and correction circuit and an oscillation and dividing circuit in the form of a block diagram.

In FIG. 36, when a serial data input 131 is input to a synchronizing circuit 132, the input signal is synchronized to take in the data. The acquired data is determined whether it is data to be received by the ID collating circuit 134 after detecting and correcting its communication error by the error correction circuit 133. When it is determined to be data to be received from a coincidence of IDs, the data is acquired in succession.

Data, converted from serial to parallel, of a plurality of IDs is written to the ID collating circuit 134 form a microprocessor circuit B sequentially from a head bit. If an 8-bit CPU is used for example, it is possible to compare up to eight IDs at the same time. If IDs more than that are assigned, IDs are transferred by dividing it into more than twice every time when one bit is received. When the data is written, the data is compared with the received data. When the comparison is finished, the microprocessor circuit B can stop its operation without any trouble until when next one bit is received. In stopping the operation, it stops the system clock similarly to general microprocessors. Actually, the system clock 164 is stopped by writing a logical value 0 to a latch 162 by using a latch lock 11 and a latch data 166 and by disabling an AND gate 163. In receiving bits of the ID, a comparison routine of the microprocessor circuit B is activated every time when one bit is received and is stopped again when its comparison is finished. For that end, the latch 162 is set (by writing a logical value 1) by an output signal of the synchronizing circuit 132 in addition to a normal control signal 167 and a logical value 0 is written to the latch 162 when the comparison routine is finished.

The comparison result is taken into the microprocessor circuit B via a data bus 140. The microprocessor circuit B accumulates results of inconsistency and when a certain number of or more bits do not coincide, it assumes that the ID does not coincide in accordance to a program. If all the IDs do not coincide, the receiving is terminated.

The data (message) is received in succession if a coincident ID is found even only one. The comparison process may be used similarly to other data patterns necessary for receiving, not only for IDs.

As described above, because the present invention allows to correct two-bit errors using the CRC code without preparing (bit number)×(bit number−1) modulo patterns, a high performance data processing unit for correcting errors may be realized with an almost equal circuit size with the circuit for correcting one-bit and be provided at low cost.

Because the present invention also allows to considerably reduce a number of times of shifts of input data within the data register which have been necessary in the past to correct errors in input data as described above, a number of times of level change of signals within the circuit may be reduced and errors can be determined and corrected with less operation, i.e. with less power consumption.

The present invention also has an effect that it allows to readily accommodate with more types of services than the past by switching receiving modes by using the state control means as described above.

Because the present invention can minimize the operation of the CPU in receiving serial data as described above, it has a particular effect on the improvement of a life of a battery, due to its low power consumption, and on the enhancement of the receiving sensitivity.

Because the present invention allows to execute the receiving process in receiving serial data by using relatively slow clocks while reducing the registers for storing ID codes, it allows to accommodate with an increase of ID codes flexibly with a small circuit size and has an effect on the improvement of a life of a battery, due to its low power consumption, and on the enhancement of the receiving sensitivity.

Because the present invention allows to execute the receiving process in receiving serial data by using relatively slow clocks while reducing the registers for storing ID codes and interrupt process for comparison, it allows to accommodate with an increase of ID codes flexibly with a small circuit size and has an effect on the improvement of a life of a battery, due to its low power consumption, and on the enhancement of the receiving sensitivity.

What is claimed is:

1. A receiver including a data processing unit for correcting errors in received data encoded by a cyclic redundancy check code, comprising:

a data holding section for holding received data;

a checking section for generating and outputting a syndrome in response to the received data and in accordance with the cyclic redundancy check code;

a storage section for storing a set of reference syndrome patterns obtained from taking an exclusive OR of all syndrome patterns obtained when a 1-bit error exists in the received data held in the data holding section and a syndrome pattern obtained when an error exists in the first received bit of data of the received data held in the data holding section; and a comparison section for outputting a signal indicating the presence of a coincidence in response to output data from the checking section when the output data coincides with any one of the reference syndrome patterns;

wherein the output of the data holding section is corrected when the signal output by the comparison section indicates the existence of a coincidence.

2. A receiver including a data processing unit for determining errors in bit serial input data by using a cyclic redundancy check code, comprising:

a data register for holding input message data having a given protocol comprising a data word having a predetermined length and the cyclic redundancy check code; and a checking circuit for generating a syndrome from the input message data in accordance with the cyclic redundancy check code;

wherein a level of the input message data input to the checking circuit is reversed in accordance with the oldest bit of input message data held in the data register.

3. A receiver according to claim 1; further comprising bit synchronizing means, word synchronizing means, ID storage means, ID collating means, an oscillation circuit, a timing generating circuit, a timer counter and state control means; wherein the state control means includes means for controlling a plurality of receiving modes.

4. A receiver according to claim 3; wherein the plurality of receiving modes includes a STOP mode in which only timing operations are performed, a RUN mode in which data receiving is performed in addition to timing operations, and a PAUSE mode in which maintenance of a synchronous state is performed in addition to timing but in which mode data receiving is not performed.

5. A receiver according to claim 1; further comprising a decoder circuit having a synchronizing circuit, an ID collating circuit, an error correcting circuit and a control circuit, and a microprocessor circuit having a CPU core circuit, a program ROM and a data RAM connected to the decoder circuit by data buses, address buses and a plurality of signal lines; wherein received data and data accompanying the received data are stored from the decoder circuit to an area specified in advance in a memory space including the data RAM of the microprocessor circuit regardless of a program executed by the CPU core circuit.

6. A receiver according to claim 5; wherein the area within the memory space is specified by an address register for storing a head address and a word counter for storing a number of words of data to be stored.

7. A receiver according to claim 5; wherein the area within the memory space is specified by a first address register for storing a head address and a second address register for storing a final address.

8. A receiver according to claim 5; wherein overflown data is written again sequentially from a head address of the area within the memory space when data transferred from the decoder circuit to the microprocessor circuit cannot be completely stored in the area specified in advance in the memory space.

9. A receiver according to claim 1; further comprising a decoder circuit having a synchronizing circuit, an ID collating circuit, an error correcting circuit and a control circuit, and a microprocessor circuit having a CPU core circuit, a program ROM and a data RAM connected to the decoder circuit by a data bus, an address bus and a plurality of signal lines; wherein received data and data accompanying the received data is stored from the decoder circuit to an area specified in advance in a memory space including the data RAM of the microprocessor circuit by switching the address bus and data bus with a cycle timing of a fetch command of the CPU core circuit.

10. A receiver according to claim 9; wherein the area within the memory space is specified by an address register for storing a head address and a word counter for storing a number of words of data to be stored.

11. A receiver according to claim 9; wherein the area within the memory space is specified by a first address register for storing a head address and a second address register for storing a final address.

12. A receiver according to claim 9; wherein overflown data is written again sequentially and automatically from a head address of the area within the memory space when data transferred from the decoder circuit to the microprocessor circuit cannot be completely stored in the area specified in advance in the memory space.

13. A receiver according to claim 1; further comprising serial data receiving means for receiving a selective paging signal, for acquiring data in synchronism with serial data transmitted through a communication channel, and for collating each bit of the received selective paging signal sequentially by comparing one selected bit within the selective paging signal with a corresponding bit of a plurality of pre-stored ID codes assigned to the receiver simultaneously in parallel and by selecting a next bit in the selective paging signal in succession.

14. A receiver according to claim 13; further comprising latch means for storing one bit of the received data for comparison with a corresponding bit of the prestored ID codes, a RAM, a plurality of registers controlled by a microprocessor, and a comparison circuit which inputs an output of the latch means and an output of the plurality of registers.

15. A receiver according to claim 14; wherein the plurality of ID codes assigned to the receiver is stored in the RAM after being converted from serial to parallel.

16. A receiver according to claim 1; further comprising a microprocessor circuit including a serial data input terminal, a reference clock generating circuit for generating a clock signal and a central processing unit, a synchronizing circuit connected with the serial data input terminal and the reference clock generating circuit for synchronizing signals from the serial data input terminal based on the clock signal output from the reference clock generating circuit, a register circuit connected with the synchronizing circuit and the microprocessor circuit and being set by the microprocessor circuit and released from a setting by an output signal from the synchronizing circuit, a gate circuit connected with the register circuit, the reference clock circuit and the microprocessor circuit, for controlling a supply of the clock signal output by the reference clock generating circuit to the microprocessor circuit by gating the clock signal by an output of the register circuit; wherein a processing program of the microprocessor circuit is executed in synchronism with each bit of the serial data.

* * * * *